(12) United States Patent
Kweon et al.

(10) Patent No.: US 12,347,760 B2
(45) Date of Patent: Jul. 1, 2025

(54) INTERCONNECTION STRUCTURE AND SEMICONDUCTOR PACKAGE INCLUDING THE SAME

(71) Applicant: Samsung Electronics Co., Ltd., Suwon-si (KR)

(72) Inventors: Junyun Kweon, Cheonan-si (KR); Jumyong Park, Suwon-si (KR); Jin Ho An, Seoul (KR); Dongjoon Oh, Suwon-si (KR); Jeonggi Jin, Seoul (KR); Hyunsu Hwang, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/369,684

(22) Filed: Sep. 18, 2023

(65) Prior Publication Data

US 2024/0006288 A1 Jan. 4, 2024

Related U.S. Application Data

(63) Continuation of application No. 17/308,643, filed on May 5, 2021, now Pat. No. 11,798,872.

(30) Foreign Application Priority Data

Sep. 2, 2020 (KR) .................. 10-2020-0111767

(51) Int. Cl.
*H01L 23/498* (2006.01)
*H01L 23/00* (2006.01)
(Continued)

(52) U.S. Cl.
CPC .. *H01L 23/49822* (2013.01); *H01L 23/49816* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 24/48* (2013.01); *H01L 24/73* (2013.01); *H01L 25/105* (2013.01);
(Continued)

(58) Field of Classification Search
CPC ..................... H01L 23/49822; H01L 23/5386
See application file for complete search history.

(56) References Cited

U.S. PATENT DOCUMENTS 8,558,383 B2 10/2013 Lin et al.
9,929,081 B2 3/2018 Kuo
(Continued)

*Primary Examiner* — Michele Fan
(74) *Attorney, Agent, or Firm* — Muir Patent Law, PLLC

(57) ABSTRACT

Disclosed are interconnection patterns and semiconductor packages including the same. The interconnection pattern comprises a first dielectric layer, a first interconnection pattern in the first dielectric layer, a first barrier layer between the first interconnection pattern and the first dielectric layer, a first top surface of the first barrier layer located at a level lower than that of a second top surface of the first dielectric layer and lower than that of a third top surface of the first interconnection pattern, a second barrier layer on the first barrier layer, the second barrier layer interposed between the first interconnection pattern and the first dielectric layer, a second dielectric layer on the first dielectric layer, the first interconnection pattern, and the second barrier layer, and a second interconnection pattern formed in the second dielectric layer and electrically coupled to the first interconnection pattern.

19 Claims, 18 Drawing Sheets

(51) Int. Cl.
*H01L 23/538* (2006.01)
*H01L 25/10* (2006.01)

(52) U.S. Cl.
CPC .............. *H01L 2224/16235* (2013.01); *H01L 2224/48228* (2013.01); *H01L 2224/73204* (2013.01); *H01L 2225/1023* (2013.01); *H01L 2225/1035* (2013.01); *H01L 2225/1058* (2013.01); *H01L 2924/182* (2013.01)

(56) References Cited

U.S. PATENT DOCUMENTS

| | | |
|---|---|---|
| 9,991,200 B2 | 6/2018 | Ting et al. |
| 10,121,748 B2 | 11/2018 | Kudo et al. |
| 10,529,679 B2 | 1/2020 | Hou et al. |
| 10,566,229 B2 | 2/2020 | Shih et al. |
| 2002/0100984 A1 | 8/2002 | Oshima et al. |
| 2005/0263891 A1 | 12/2005 | Lee et al. |
| 2010/0163834 A1* | 7/2010 | Chang ............... H10N 70/8413 438/653 |
| 2012/0043630 A1 | 2/2012 | Omori et al. |
| 2013/0127056 A1 | 5/2013 | Yun et al. |
| 2016/0268199 A1 | 9/2016 | Lee et al. |
| 2017/0271283 A1 | 9/2017 | Lee et al. |
| 2019/0148289 A1 | 5/2019 | Seo et al. |
| 2019/0385963 A1* | 12/2019 | Chen ....................... H01L 25/50 |

\* cited by examiner

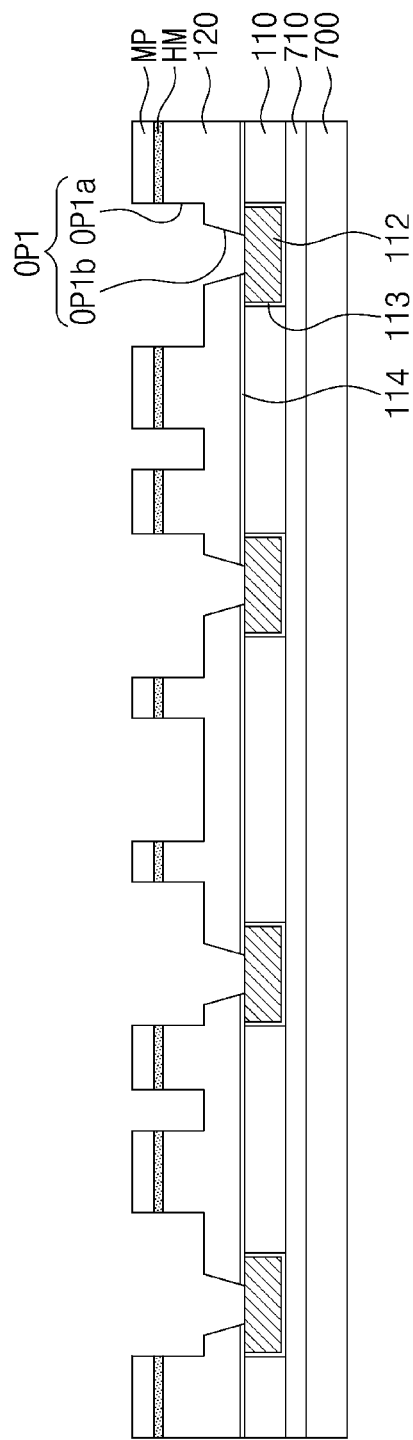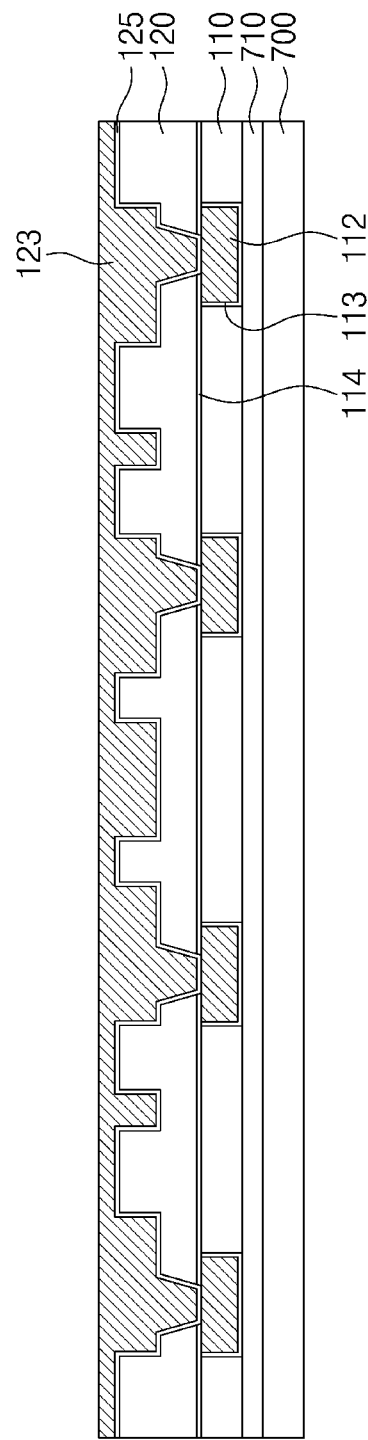

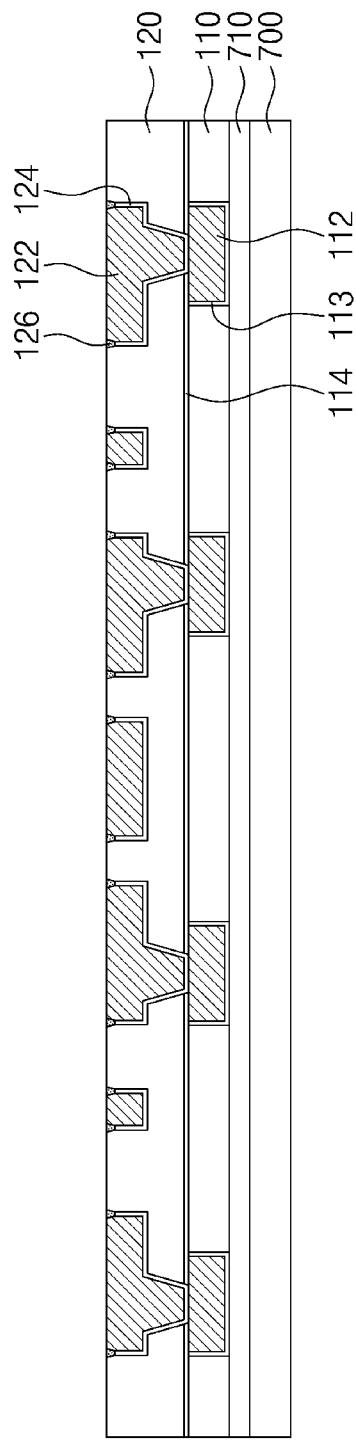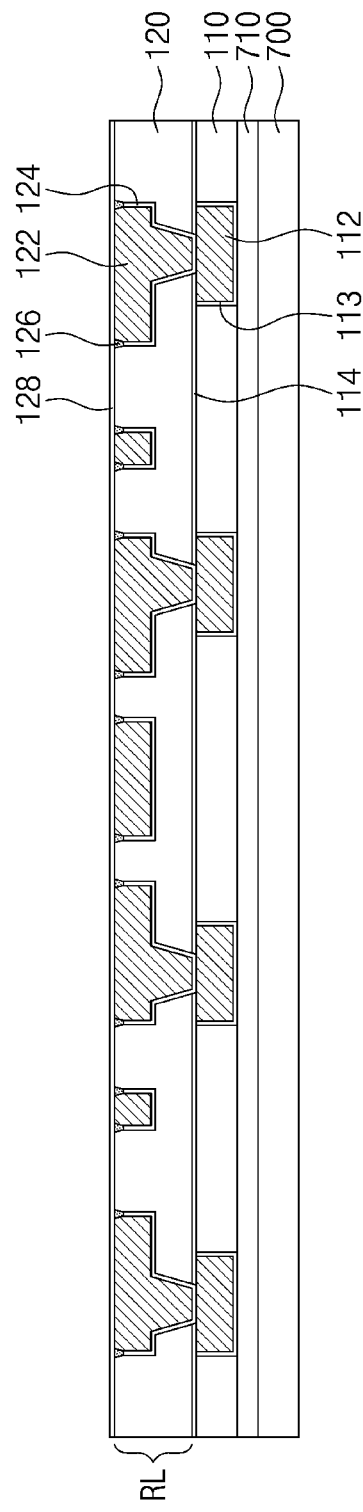

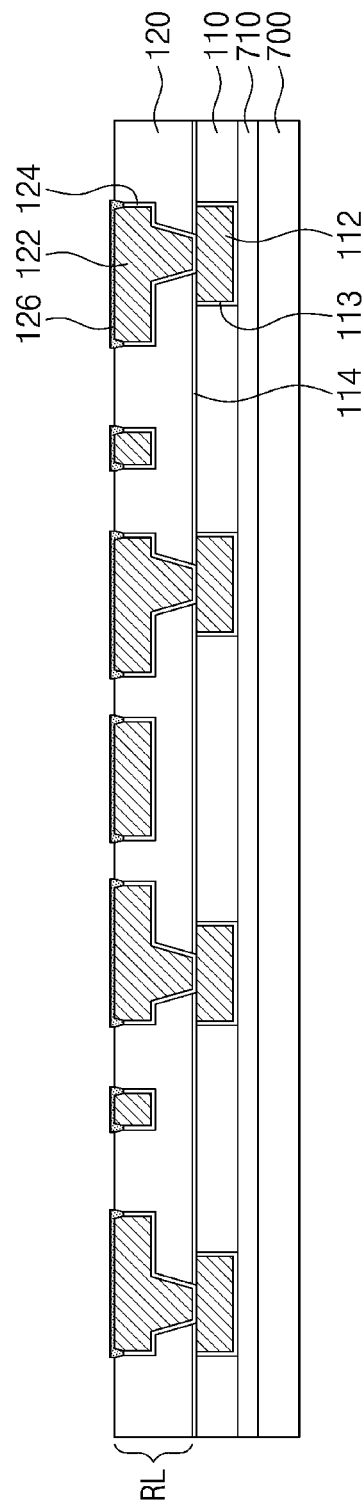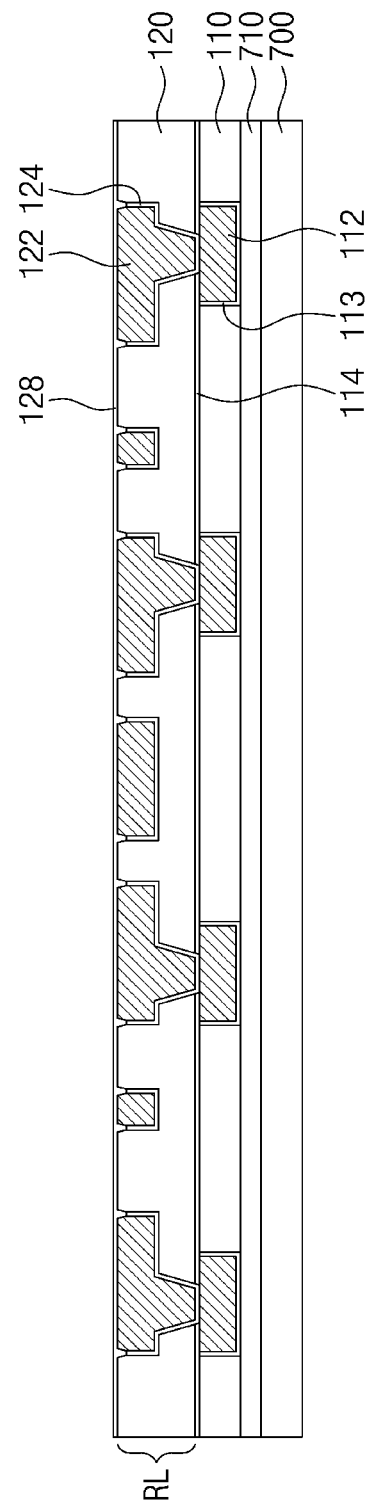

INTERCONNECTION STRUCTURE AND SEMICONDUCTOR PACKAGE INCLUDING THE SAME

CROSS-REFERENCE TO RELATED APPLICATION

This application is a continuation of U.S. application Ser. No. 17/199,703 filed Mar. 12, 2021, which claims priority under 35 U.S.C. § 119 to Korean Patent Application No. 10-2020-0111767, filed on Sep. 2, 2020, in the Korean Intellectual Property Office, the entire contents of each of these applications being hereby incorporated by reference.

BACKGROUND

The present inventive concepts relate to an interconnection structure and a semiconductor package including the same.

Semiconductor chips are gradually becoming compact with the continuous development of semiconductor technology. In contrast, various functions are integrated into a single semiconductor chip. Therefore, semiconductor chips have a great number of input/output pads on a small area.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. Various studies are conducted to improve structural stability and electrical properties without pattern abnormality.

SUMMARY

Some example embodiments of the present inventive concepts provide an interconnection structure with improved structural stability and a semiconductor package including the same.

Objects of the present inventive concepts are not limited to the mentioned above, and other objects which have not been mentioned above will be clearly understood to those skilled in the art from the following description.

According to some example embodiments of the present inventive concepts, an interconnection structure may comprise: a first dielectric layer; a first interconnection pattern in the first dielectric layer; a first barrier layer between the first interconnection pattern and the first dielectric layer, wherein a first top surface of the first barrier layer is located at a level lower than a level of a second top surface of the first dielectric layer and lower than a level of a third top surface of the first interconnection pattern; a second barrier layer on the first barrier layer, the second barrier layer interposed between the first interconnection pattern and the first dielectric layer; a second dielectric layer on the first dielectric layer, the first interconnection pattern, and the second barrier layer; and a second interconnection pattern formed in the second dielectric layer and electrically coupled to the first interconnection pattern.

According to some example embodiments of the present inventive concepts, an interconnection structure may comprise: a first dielectric layer including an opening, wherein the opening has a lower part and an upper part, the upper part having a horizontal width greater than a horizontal width of the lower part; a first interconnection pattern in the opening; a barrier layer between the first dielectric layer and the first interconnection pattern; a passivation layer that covers a top surface of the first interconnection pattern; a second dielectric layer on the first dielectric layer and the passivation layer; a second interconnection pattern that penetrates the second dielectric layer and is electrically coupled to the first interconnection pattern; and an external terminal below the first dielectric layer, the external terminal electrically connected to the first interconnection pattern. The barrier layer may include: a first barrier layer in the lower part of the opening; and a second barrier layer in the upper part of the opening.

According to some example embodiments of the present inventive concepts, a semiconductor package may comprise: a redistribution substrate that includes at least one redistribution layer; a semiconductor chip mounted on the redistribution substrate; a plurality of chip pads on one surface of the semiconductor chip, the one surface being directed toward the redistribution substrate; a plurality of substrate pads on a top surface of the redistribution substrate, the top surface being directed toward the semiconductor chip; a plurality of external terminals on a bottom surface of the redistribution substrate; and a molding member on the top surface of the redistribution substrate, the molding member covering the semiconductor chip. The redistribution layer may include: a dielectric layer; an interconnection pattern that includes a head part exposed with respect to a top surface of the dielectric layer and a tail part connected to the head part, the tail part extending from the head part to a bottom surface of the dielectric layer; a first barrier layer between the dielectric layer and the interconnection pattern; a second barrier layer on the first barrier layer and between the dielectric layer and the head part of the interconnection pattern; and a passivation layer that covers a top surface of the dielectric layer and a top surface of the interconnection pattern. The top surface of the dielectric layer, the top surface of the interconnection pattern, and a top surface of the second barrier layer may be coplanar.

BRIEF DESCRIPTION OF THE DRAWINGS

FIGS. 8 to 21 are cross-sectional views illustrating a method of fabricating an interconnection structure according to some example embodiments of the present inventive concepts.

DETAILED DESCRIPTION OF EMBODIMENTS

The following will now describe an interconnection structure according to the present inventive concepts with reference to accompanying drawings.

Figure 1:
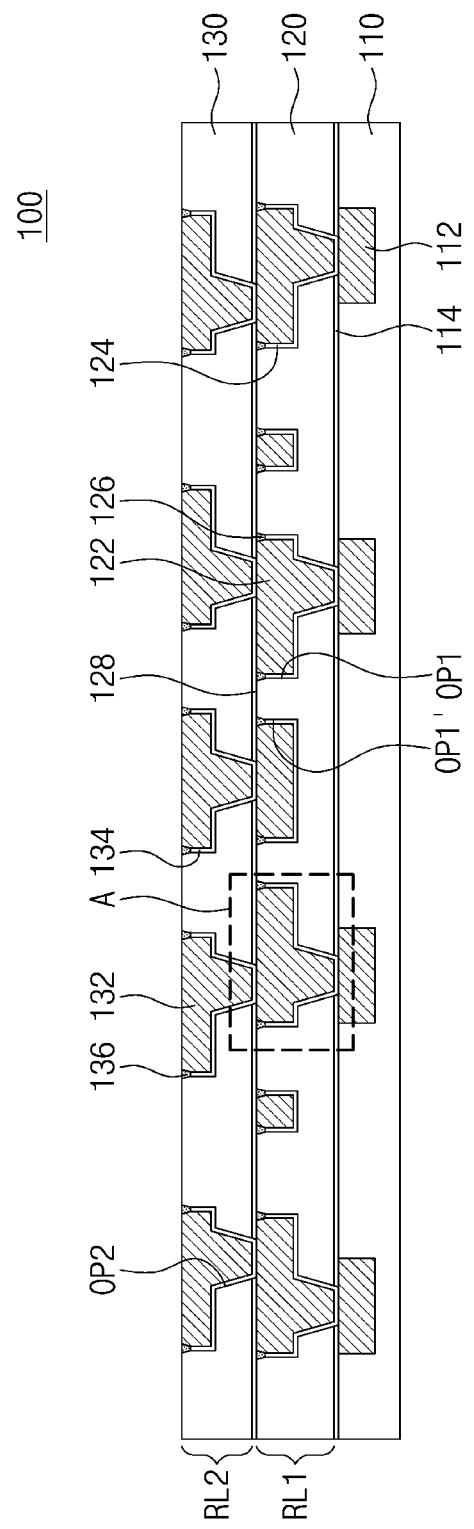
FIG. 1 is a simplified cross-sectional view illustrating redistribution layers of an interconnection structure according to some example embodiments of the present inventive concepts.
Figure 2:
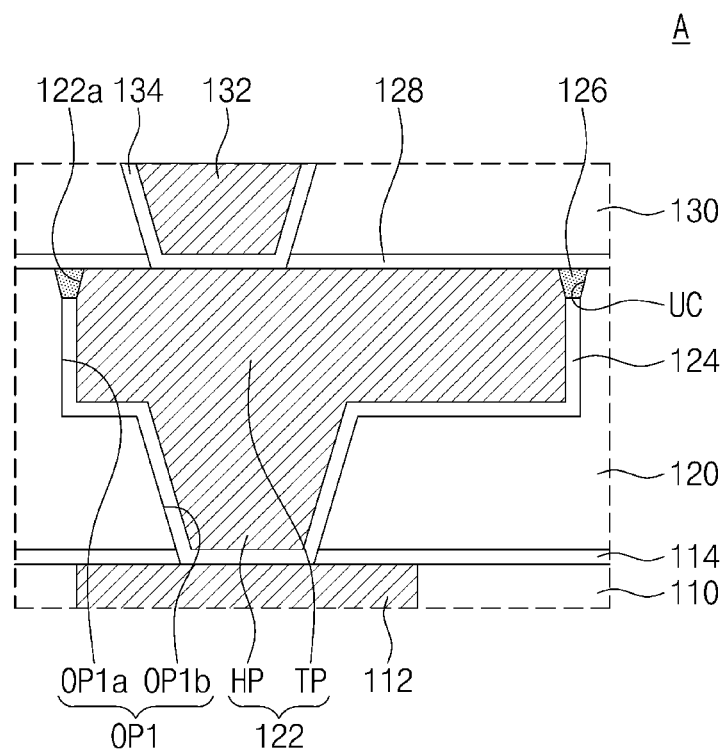
FIGS. 2 to 4 are enlarged views of section A marked in FIG. 1.
Figure 3:
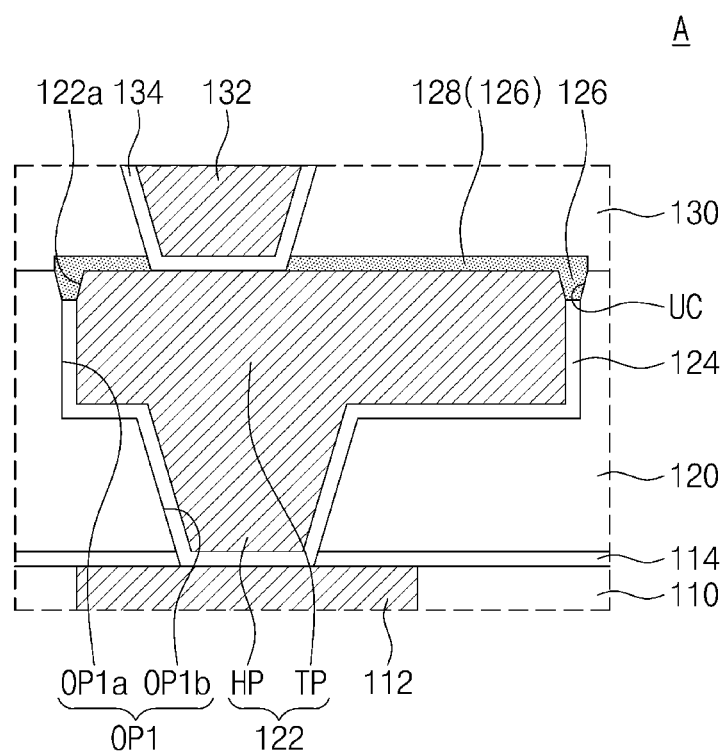
Figure 4:
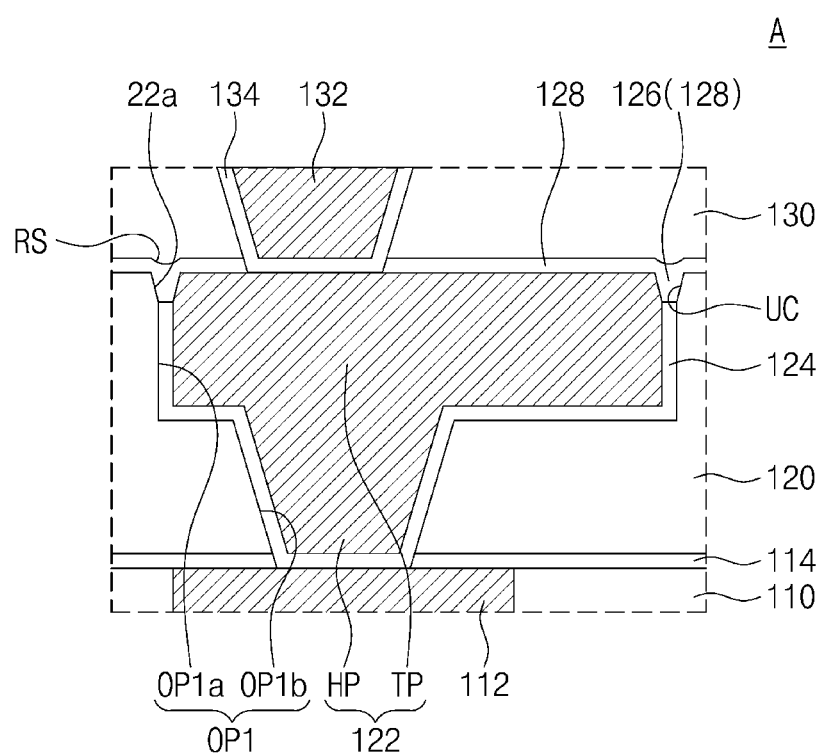

FIG. 1 is a simplified cross-sectional view illustrating redistribution layers of an interconnection structure according to some example embodiments of the present inventive concepts. FIGS. 2 to 4 are enlarged views showing section A of FIG. 1.

Referring to FIGS. 1 and 2, an interconnection structure 100 may include one or more redistribution layers RL1 and RL2 provided on a substrate 110. In this description, the interconnection structure 100 may be an interconnection substrate, an interconnection layer, or a redistribution substrate each of which is used for semiconductor packages in various embodiments.

The substrate 110 may be a dielectric substrate. For example, the substrate 110 may include and/or be formed of a dielectric polymer or a photosensitive polymer. Substrate pads 112 may be formed in the substrate 110 for the substrate pads 112 to be electrically connected to a first redistribution layer RL1 which will be discussed below. The substrate pads 112 may be embedded in the substrate 110. The substrate pads 112 may be exposed on a top surface of the substrate 110. A substrate passivation layer 114 may be formed on the substrate 110 to cover the substrate pads 112. For example, the substrate passivation layer 114 may cover portions of the top surfaces of the substrate pads 112. The substrate passivation layer 114 may entirely cover the top surface of the substrate 110.

A first redistribution layer RL1 may be provided on the substrate 110. The first redistribution layer RL1 may include a first dielectric layer 120, a first interconnection pattern 122, a first barrier layer 124, and a second barrier layer 126.

The first dielectric layer 120 may be disposed on the substrate passivation layer 114 formed on the substrate 110. For example, the substrate passivation layer 114 may be interposed between the substrate 110 and the first dielectric layer 120. The first dielectric layer 120 may include and/or be formed of a photosensitive polymer or a photo-imageable dielectric (PID). For example, the photosensitive polymer may include one or more of photosensitive polyimide, polybenzoxazole (PBO), phenolic polymers, and benzocyclobutene polymers.

The first dielectric layer 120 may have first openings OP1. The first openings OP1 may vertically penetrate the first dielectric layer 120. The first openings OP1 may have their T-shaped cross-sections. For example, the first openings OP1 may each have an upper part OP1a connected to a top surface of the first dielectric layer 120 and a lower part OP1b connected to a bottom surface of the first dielectric layer 120. The upper and lower parts OP1a and OP1b of the first opening OP1 may vertically overlap each other and may be connected to each other. The upper part OP1a of the first opening OP1 may have a width greater than that of the lower part OP1b of the first opening OP1. The upper part OP1a of the first opening OP1 may have an inner lateral surface and a bottom surface that are connected to those of the lower part OP1b of the first opening OP1. For example, the upper part OP1a of the first opening OP1 may have lateral surfaces extending vertically in a cross-sectional view, and have a horizontal/bottom surface extending horizontally in a cross-sectional view. The lower part OP1b of the first opening OP1 may extend downwardly from the bottom surface of the upper part OP1a of the first opening OP1. The width of the lower part OP1b of the first opening OP1 in a horizontal direction may decrease in a direction approaching the substrate 110. The lower part OP1b of the first opening OP1 may be formed to penetrate the first dielectric layer 120 and the substrate passivation layer 114. For example, the first openings OP1 may penetrate the first dielectric layer 120 and the substrate passivation layer 114, thereby exposing the substrate pads 112.

Certain first openings OP1' among the first openings OP1 may not have the lower part OP1b. For example, the certain first openings OP1' may be formed on an upper portion of the first dielectric layer 120 and may not penetrate through the bottom surface of the first dielectric layer 120. The first openings OP1 formed to penetrate through the top and bottom surfaces of the first dielectric layer 120 may each correspond to a region that is provided therein with a via and/or a pad part of the first interconnection pattern 122 electrically connected to the substrate pad 112, and the certain first opening OP1' that is formed not to penetrate through the bottom surface of the first dielectric layer 120 may correspond to a region that is provided therein with a pad or line part of the first interconnection pattern 122 connected to a second interconnection pattern 132 which will be discussed below.

The first interconnection pattern 122 may be provided in each of the first openings OP1. The first interconnection pattern 122 may have a damascene structure, e.g., a dual damascene structure. For example, the first interconnection pattern 122 may have a head part HP and a tail part TP that are integrally connected into a single piece. The head part HP may correspond to the pad part discussed above, and the tail part TP may correspond to the via part discussed above. The head part HP may fill the upper part OP1a of the first opening OP1, and the tail part TP may fill the lower part OP1b of the first opening OP1. The head part HP and the tail part TP may vertically overlap each other, and the tail part TP may extend downwardly from the head part HP onto the bottom surface of the first dielectric layer 120. The head part HP and the tail part TP may have no interface/boundary therebetween. The first interconnection pattern 122 may have a top surface, or a top surface of the head part HP, at the same level as that of the top surface of the first dielectric layer 120. The tail part TP may be electrically coupled to the substrate pad 112. For example, the first barrier layer 124 may be formed under the tail part TP, and the first barrier layer 124 may contact the substrate pad 112. FIG. 1 roughly depicts the substrate 110, but when the substrate 110 is provided as a redistribution layer, the substrate pads 112 may correspond to redistribution patterns of the redistribution layer. The first interconnection pattern 122 provided in the specific first opening OP1' may correspond to the line part discussed above. The first interconnection pattern 122 may include or may be formed of a conductive material. For example, the first interconnection pattern 122 may include and/or be formed of copper (Cu).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first barrier layer 124 may be interposed between the first dielectric layer 120 and the first interconnection pattern 122. The first barrier layer 124 may conformally cover the inner lateral and the bottom surfaces of the upper part OP1a of the first opening OP1, and may also conformally cover the inner lateral and the bottom surfaces of the lower part OP1b of the first opening OP1. For example the bottom surfaces of the lower part OP1b of the first opening OP1 may be a top surface of the substrate pad 112. The first barrier layer 124 may surround the head and tail parts HP and TP of the first interconnection pattern 122. A thickness of the first barrier layer 124 may be about 20 nm to about 200 nm. For example, a gap between the first interconnection pattern 122 and the first dielectric layer 120 may be about 20 nm to about 200 nm. The first barrier layer 124 may include and/or be formed of titanium (Ti), tantalum (Ta), titanium nitride (TiN), or tantalum nitride (TaN). In certain embodiments, the first barrier layer 124 and the first interconnection pattern 122 may be called as an interconnection pattern.

The first barrier layer 124 may have an uppermost end at a vertical level lower level than that of the top surface of the first dielectric layer 120 and that of the top surface of the first interconnection pattern 122. For example, the first barrier layer 124 may be provided thereon with an undercut region UC that is surrounded by the first dielectric layer 120, the first barrier layer 124, and the first interconnection pattern 122. The undercut region UC may be, for example, a region that is recessed toward the substrate 110 with respect to the top surface of the first dielectric layer 120 and the top surface of the first interconnection pattern 122. The undercut region UC may have an inner lateral surface that is inclined to the top surface of the first dielectric layer 120 or the top surface of the first interconnection pattern 122. For example, the undercut region UC may have a width in a horizontal direction that decreases in a direction approaching the substrate 110 from the top surface of the first dielectric layer 120. An inclined surface 122a may be provided to a portion of an upper part of the first interconnection pattern 122 exposed on the inner lateral surface of the undercut region UC. The undercut region UC may have a bottom surface on which a top surface of the first barrier layer 124 is exposed. The undercut region UC may have a depth of about 10 nm to about 20 nm, which depth is defined as a vertical distance from the top surface of the first dielectric layer 120 to the bottom surface of the undercut region UC. For example, the undercut region UC may be a downwardly over etched area by a chemical mechanical polishing (CMP) process or another etching process.

The second barrier layer 126 may be provided in the undercut region UC. The second barrier layer 126 may fill the undercut region UC. For example, on the first barrier layer 124, the second barrier layer 126 may separate the first dielectric layer 120 from the head part HP of the first interconnection pattern 122. For example, the second barrier layer 126 may be interposed between the first dielectric layer 120 and the head part HP of the first interconnection pattern 122. The second barrier layer 126 may contact the inclined surface 122a of the first interconnection pattern 122 and may surround the first interconnection pattern 122. The second barrier layer 126 may contact the top surface of the first barrier layer 124. An interface between the first and second barrier layers 124 and 126 may be positioned in the upper part OP1a of the first opening OP1, and for example, the interface may be placed between top and bottom surfaces of the head part HP of the first interconnection pattern 122. The second barrier layer 126 may have a top surface coplanar with that of the first dielectric layer 120 and that of the first interconnection pattern 122. For example, the second barrier layer 126 may have a height the same as the depth of the undercut region UC. The height of the second barrier layer 126 may range from about 10 nm to about 200 nm. The second barrier layer 126 may have a thickness/width in a horizontal direction that decreases in a direction approaching the substrate 110 from the top surface of the first dielectric layer 120. On the interface between the first and second barrier layers 124 and 126, the second barrier layer 126 may have the same thickness as that of the first barrier layer 124. For example, the interface between the first and second barrier layers 124 and 126 may correspond to the lowermost surface of the second barrier layer 126. On the top surface of the second barrier layer 126, the second barrier layer 126 may have a thickness greater than that of the first barrier layer 124. The second barrier layer 126 may have a thickness of about 20 nm to about 400 nm. The second barrier layer 126 may include and/or be formed of a metallic material whose ionization tendency is greater than that of a metallic material included in and/or forming the first interconnection pattern 122. For example, the second barrier layer 126 may include and/or be formed of nickel (Ni). As the second barrier layer 126 is provided to surround an upper portion of the first interconnection pattern 122, oxygen may be prevented from diffusing into the first interconnection pattern 122 from the first dielectric layer 120 or a second dielectric layer 130 which will be discussed below, and the first interconnection pattern 122 may be prevented/protected from being damaged.

The first redistribution layer RL1 may further include a passivation layer 128 provided on the first dielectric layer 120. The passivation layer 128 may cover the top surface of the first dielectric layer 120, the top surface of the first interconnection pattern 122, and the top surface of the second barrier layer 126. The passivation layer 128 may have a thickness of about 20 nm to about 400 nm. The passivation layer 128 may include and/or be formed of a dielectric material. For example, the passivation layer 128 may include and/or be formed of silicon nitride (SiN).

According to some example embodiments, the passivation layer 128 may be a portion of the second barrier layer 126. As shown in FIG. 3, the portion 128 of the second barrier layer 126 may extend from the undercut region UC onto the top surface of the first interconnection pattern 122. For example, the second barrier layer 126 may cover lateral and top surfaces of the head part HP of the first interconnection pattern 122. Therefore, the second barrier layer 126 may have an uppermost surface (or a top surface of the portion 128 of the second barrier layer 126) at a higher level than that of the top surface of the first dielectric layer 120 and that of the top surface of the first interconnection pattern 122. The second barrier layer 126 may separate the first interconnection pattern 122 from the first dielectric layer 120 and a second dielectric layer 130 which will be discussed below. For example, the second barrier layer 126 may be interposed between the first interconnection pattern 122 and the second dielectric layer 130. The second barrier layer 126 may have a thickness of about 20 nm to about 400 nm. The portion 128 of the second barrier layer 126 may include and/or be formed of a metallic material whose ionization tendency is greater than that of a metallic material included in and/or forming the first interconnection pattern 122. For example, the portion 128 of the second interconnection pattern 126 may include and/or be formed of nickel (Ni). Therefore, oxygen may be prevented from diffusing into the first interconnection pattern 122 from the first dielectric layer 120 or a second dielectric layer 130 which will be discussed below, and the first interconnection pattern 122 may be prevented/protected from being damaged. The portion 128 of the second barrier layer 126 that extends onto the top surface of the first interconnection pattern 122 may have the same role as that of the passivation layer 128, e.g., illustrated in FIGS. 1 and 2. The portion 128, which corresponds to the passivation layer 128, of the second barrier layer 126 in the embodiment of FIG. 3 may not extend onto the top surface of the first dielectric layer 120.

According to some example embodiments, the second barrier layer 126 may be a portion of the passivation layer 128. As shown in FIG. 4, the passivation layer 128 may cover the top surface of the first dielectric layer 120 and the top surface of the first interconnection pattern 122. The portion 126 of the passivation layer 128 may extend into the undercut region UC. In the undercut region UC, the passivation layer 128 may contact the top surface of the first barrier layer 124. The passivation layer 128 may have a recess RS, which is recessed toward the undercut region UC, at a portion of its top surface positioned on the undercut region UC. The portion 126 of the passivation layer 128 may cover a lateral surface (e.g., the inclined surface 122a) of the first interconnection pattern 122, and may surround the first interconnection pattern 122. The portion 126 of the passivation layer 128 may separate the first interconnection pattern 122 from the first dielectric layer 120. For example, the portion 126 of the passivation layer 128 may be interposed between the first interconnection pattern 122 and the first dielectric layer 120. For example, the portion 126 and the other portion of the passivation layer 128 may be integrally formed to be a single body. Therefore, oxygen may be prevented from diffusing into the first interconnection pattern 122 from the first dielectric layer 120 or a second dielectric layer 130 which will be discussed below, and the first interconnection pattern 122 may be prevented/protected from being damaged. The portion 126, which extends into the undercut region UC, of the passivation layer 128 may have the same role as that of the second barrier layer 126, e.g., illustrated in FIGS. 1 and 2. The passivation layer 128 may have a thickness of about 20 nm to about 400 nm.

The following will focus on the embodiment of FIG. 2.

A second redistribution layer RL2 may be disposed on the first redistribution layer RL1. The second redistribution layer RL2 may be configured substantially identically or similarly to the first redistribution layer RL1. For example, the second redistribution layer RL2 may include a second dielectric layer 130, a second interconnection pattern 132, a third barrier layer 134, and a fourth barrier layer 136.

Terms such as "same," "identical," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second dielectric layer 130 may be disposed on the passivation layer 128 of the first redistribution layer RL1. The second dielectric layer 130 may include and/or be formed of a photosensitive polymer or a photo-imageable dielectric (PID).

The second dielectric layer 130 may have second openings OP2. The second openings OP2 may vertically penetrate the second dielectric layer 130. The second openings OP2 may have their T-shaped cross-sections. The second openings OP2 may be formed to penetrate the second dielectric layer 130 and the passivation layer 128. For example, the second openings OP2 may penetrate the second dielectric layer 130 and the passivation layer 128, thereby exposing the top surfaces of the first interconnection patterns 122. As shown in the embodiment of FIG. 3, when the second barrier layer 126 is formed to cover the first interconnection pattern 122, the second openings OP2 may penetrate the second dielectric layer 130 and the second barrier layer 126, thereby exposing the top surfaces of the first interconnection patterns 122.

The second interconnection pattern 132 may be provided in each of the second openings OP2. The second interconnection pattern 132 may have a damascene structure, e.g., a dual damascene structure. For example, the second interconnection pattern 132 may have a head part and a tail part that are integrally connected into a single piece. The second interconnection pattern 132 may have a top surface at the same level as that of a top surface of the second dielectric layer 130. The second interconnection pattern 132 may be electrically coupled to the first interconnection pattern 122. For example, the third barrier layer 134 may be formed under the second interconnection pattern 132, and the third barrier layer 134 may contact the first interconnection pattern 122. The second interconnection pattern 132 may include and/or be formed of a conductive material. For example, the second interconnection pattern 132 may include and/or be formed of copper (Cu).

The third barrier layer 134 may be interposed between the second dielectric layer 130 and the second interconnection pattern 132. The third barrier layer 134 may conformally cover an inner lateral surface and a bottom surface of the second openings OP2. The third barrier layer 134 may surround the second interconnection pattern 132. A thickness of the third barrier layer 134 may be about 20 nm to about 200 nm. For example a gap between the second interconnection pattern 132 and the second dielectric layer 130 may be about 20 nm to about 200 nm. The third barrier layer 134 may include and/or be formed of titanium (Ti), tantalum (Ta), titanium nitride (TiN), or tantalum nitride (TaN).

The third barrier layer 134 may have an uppermost end at a lower level than that of the top surface of the second dielectric layer 130 and that of the top surface of the second interconnection pattern 132. For example, an undercut region may be provided which is recessed toward the substrate 110 with respect to the top surface of the second dielectric layer 130 and the top surface of the second interconnection pattern 132. A vertical distance from the top surface of the second dielectric layer 130 to a top surface of the third barrier layer 134 may range from about 10 nm to about 20 nm.

The fourth barrier layer 136 may be provided on the third barrier layer 134. On the third barrier layer 134, the fourth barrier layer 136 may separate an upper portion of the second interconnection pattern 132 from the second dielectric layer 130. For example, the fourth barrier layer 136 may be interposed between the upper portion of the second interconnection pattern 132 and the second dielectric layer 130. The fourth barrier layer 136 may surround the second interconnection pattern 132. The fourth barrier layer 136 may contact the top surface of the third barrier layer 134. The fourth barrier layer 136 may have a top surface coplanar with that of the second dielectric layer 130 and that of the second interconnection pattern 132. The fourth barrier layer 136 may have a height of about 10 nm to about 20 nm. The fourth barrier layer 136 may have a thickness/widths in a horizontal direction that decreases in a direction approaching the substrate 110 from the top surface of the second dielectric layer 130. On an interface between the third and fourth barrier layers 134 and 136, the fourth barrier layer 136 may have the same thickness in a horizontal direction as that of the third barrier layer 134. On the top surface of the fourth barrier layer 136, the fourth barrier layer 136 may have a thickness in the horizontal direction greater than that of the third barrier layer 134. The fourth barrier layer 136 may have a thickness of about 20 nm to about 400 nm in the horizontal direction. The fourth barrier layer 136 may include and/or be formed of a metallic material whose ionization tendency is greater than that of a metallic material included in and/or forming the second interconnection pattern 132. For example, the fourth barrier layer 136 may include and/or be formed of nickel (Ni). As the fourth barrier layer 136 is provided to surround an upper portion of the second interconnection pattern 132, oxygen may be prevented from diffusing into the second interconnection pattern 132 from the second dielectric layer 130, and the second interconnection pattern 132 may be prevented/protected from being damaged.

FIGS. 1 to 4 depict the interconnection structure 100 including two redistribution layers RL1 and RL2, but the present inventive concepts are not limited thereto. In certain embodiments, the interconnection structure 100 may include one or at least three redistribution layers.

Figure 5:
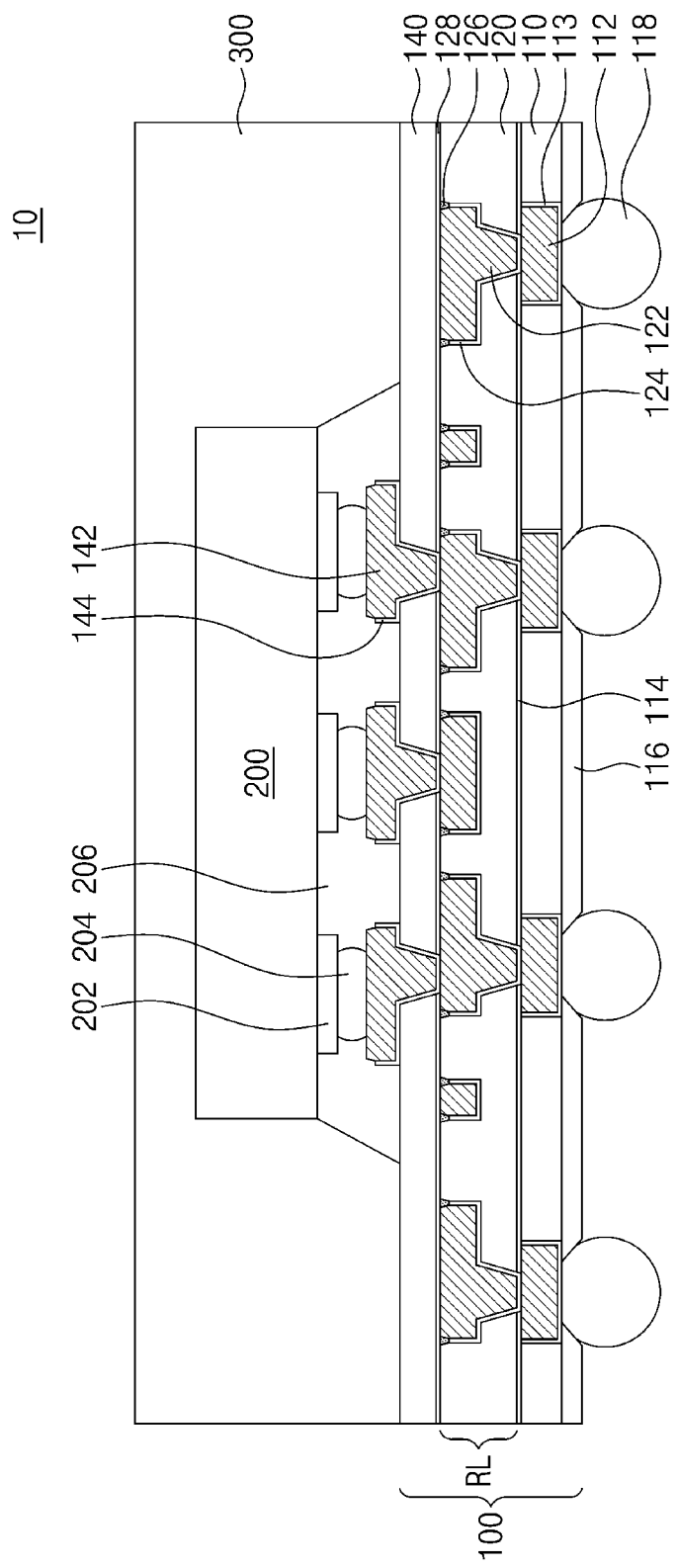
FIGS. 5 to 7 are cross-sectional views illustrating a semiconductor package including an interconnection structure according to some example embodiments of the present inventive concepts.

FIG. 5 is a cross-sectional view illustrating a semiconductor package including an interconnection structure according to some example embodiments of the present inventive concepts.

Referring to FIG. 5, a semiconductor package 10 may include a lower redistribution substrate 100, a first semiconductor chip 200, and a first molding member 300.

The lower redistribution substrate 100 may be the same as or similar to the interconnection structure 100 discussed with reference to FIGS. 1 to 4.

The lower redistribution substrate 100 may include a lower dielectric layer 110 and a redistribution layer RL.

The lower dielectric layer 110 may correspond to the substrate 110 discussed with reference to FIG. 1. The lower dielectric layer 110 may include and/or be formed of a dielectric polymer or a photosensitive polymer. Substrate pads 112 may be embedded in the lower dielectric layer 110. The substrate pads 112 may be exposed on top and bottom surfaces of the lower dielectric layer 110. In case a seed/barrier layer 113 is formed under the substrate pads 112, the seed/barrier layer 113 may be exposed with respect to the bottom surfaces of the lower dielectric layer 110 as shown in FIG. 5. For example, a seed/barrier layer 113 may be formed on each of the substrate pads 112 to cover bottom and lateral surfaces of a corresponding substrate pad 112. Differently from that shown, the seed/barrier layer 113 may be provided only on the bottom surface of the substrate pad 112. The seed/barrier layer 113 may include and/or be formed of copper (Cu) or titanium (Ti). A substrate passivation layer 114 may be formed on the lower dielectric layer 110 to cover the substrate pads 112. For example, the substrate passivation layer 114 may cover portions of the top surfaces of the substrate pads 112. The substrate passivation layer 114 may entirely cover the top surface of the lower dielectric layer 110.

A protective layer 116 may be provided on the bottom surface of the lower dielectric layer 110. The protective layer 116 may cover the bottom surface of the lower dielectric layer 110 and may expose the bottom surfaces of the substrate pads 112, e.g., in case the seed/barrier layer 113 is not formed under the bottom surfaces of the substrate pads 112. For example, the seed/barrier layer 113 may be exposed through opening formed in the protective layer 116 in case the seed/barrier layer 113 is formed under the bottom surfaces of the substrate pads 112. External terminals 118 may be provided on the exposed bottom surfaces of the substrate pads 112 or the seed/barrier layer 113. The external terminals 118 may include or may be solder balls or solder bumps.

The redistribution layer RL may be disposed on the lower dielectric layer 110. The redistribution layer RL may be configured identically or similarly to the first redistribution layer RL1 discussed with reference to FIG. 1.

The redistribution layer RL may include a first dielectric layer 120, a first interconnection pattern 122, a first barrier layer 124, and a second barrier layer 126.

The first dielectric layer 120 may be disposed on the lower dielectric layer 110. The first dielectric layer 120 may include and/or be formed of a photosensitive polymer or a photo-imageable dielectric (PID).

The first interconnection pattern 122 may be provided in the first dielectric layer 120. The first interconnection pattern 122 may have a damascene structure, e.g., a dual damascene structure. For example, the first interconnection pattern 122 may have a T-shaped cross-section. The first interconnection pattern 122 may have a top surface at the same level as that of a top surface of the first dielectric layer 120. The first interconnection patterns 122 may penetrate the first dielectric layer 120 and a substrate passivation layer 114, thereby being electrically coupled to a substrate pad 112. For example, the first barrier layer 124 formed under the first interconnection patterns 122 may contact the substrate pads 112. The first interconnection pattern 122 may include and/or be formed of a conductive material.

The first barrier layer 124 may be interposed between the first dielectric layer 120 and the first interconnection pattern 122. The first barrier layer 124 may surround the first interconnection pattern 122. The first barrier layer 124 may include and/or be formed of titanium (Ti), tantalum (Ta), titanium nitride (TiN), or tantalum nitride (TaN). The first barrier layer 124 may have an uppermost end at a lower level than that of the top surface of the first dielectric layer 120 and that of the top surface of the first interconnection pattern 122. For example, an undercut region may be provided which is recessed toward the lower dielectric layer 110 with respect to the top surface of the first dielectric layer 120 and the top surface of the first interconnection pattern 122.

The second barrier layer 126 may be provided on the first barrier layer 124. On the first barrier layer 124, the second barrier layer 126 may separate an upper portion of the first interconnection pattern 122 from the first dielectric layer 120. For example, the second barrier layer 126 may be interposed between the upper portion of the first interconnection pattern 122 and the first dielectric layer 120. The second barrier layer 126 may surround the first interconnection pattern 122. The second barrier layer 126 may contact a top surface of the first barrier layer 124. The second barrier layer 126 may have a top surface coplanar with that of the first dielectric layer 120 and that of the first interconnection pattern 122. The second barrier layer 126 may include and/or be formed of a metallic material whose ionization tendency is greater than that of a metallic material included in and/or forming the first interconnection pattern 122. For example, the second barrier layer 126 may include and/or be formed of nickel (Ni).

A passivation layer 128 may be provided on the first dielectric layer 120. The passivation layer 128 may cover the top surface of the first dielectric layer 120, the top surface of the first interconnection pattern 122, and the top surface of the second barrier layer 126.

A third dielectric layer 140 may be provided on the redistribution layer RL. The third dielectric layer 140 may be disposed on the first dielectric layer 120. The third dielectric layer 140 may include and/or be formed of a photosensitive polymer or a photo-imageable dielectric (PID).

A third interconnection pattern 142 may be provided in the third dielectric layer 140. The third interconnection pattern 142 may have a T-shaped cross-section. The third interconnection pattern 142 may have a head part provided on a top surface of the third dielectric layer 140, and may also have a tail part in the third dielectric layer 140, which tail part penetrates the third dielectric layer 140 and is electrically coupled to the first interconnection pattern 122. For example, a fifth barrier layer 144 may be formed under the third interconnection pattern 142, and the fifth barrier layer 144 may contact the first interconnection pattern 122. The third interconnection pattern 142 may include and/or be formed of a conductive material. The head part of the third interconnection pattern 142 may be a pad part of the lower redistribution substrate 100, and the first semiconductor chip 200 may be mounted on the head part of the third interconnection pattern 142.

A fifth barrier layer 144 may be interposed between the third dielectric layer 140 and the third interconnection pattern 142. The fifth barrier layer 144 may surround the third interconnection pattern 142. The fifth barrier layer 144 may include and/or be formed of titanium (Ti), tantalum (Ta), titanium nitride (TiN), or tantalum nitride (TaN). The fifth barrier layer 144 may have an uppermost end at a lower level than that of a top surface of the third interconnection pattern 142.

The first semiconductor chip 200 may be mounted on the lower redistribution substrate 100. The first semiconductor chip 200 may be flip-chip mounted on the lower redistribution substrate 100. For example, the first semiconductor chip 200 may include chip pads 202 electrically connected to integrated circuits of the first semiconductor chip 200. Connection terminals 204 may be provided between the chip pads 202 and the third interconnection patterns 142. The chip pads 202 may be electrically connected through the connection terminals 204 to the third interconnection patterns 142. The first semiconductor chip 200 may be, for example, a logic chip. An under-fill member 206 may fill a space between the first semiconductor chip 200 and the lower redistribution substrate 100. For example, the under-fill member 206 may be a filler interposed in a space between the first semiconductor chip 200 and the lower redistribution substrate 100. Between the first semiconductor chip 200 and the lower redistribution substrate 100, the under-fill member 206 may surrounds the connection terminals 204, the chip pads 202, and the third interconnection patterns 142.

The molding member 300 may be provided on the lower redistribution substrate 100. The molding member 300 may cover the first semiconductor chip 200. The molding member 300 may include a dielectric material, such as an epoxy molding compound (EMC). For example, the molding member 300 may be a mold formed on the lower redistribution substrate 100 and covering the first semiconductor chip 200. For example, a molding member in the present disclosure may be a mold provided on a substrate and/or on a semiconductor chip.

Figure 6:
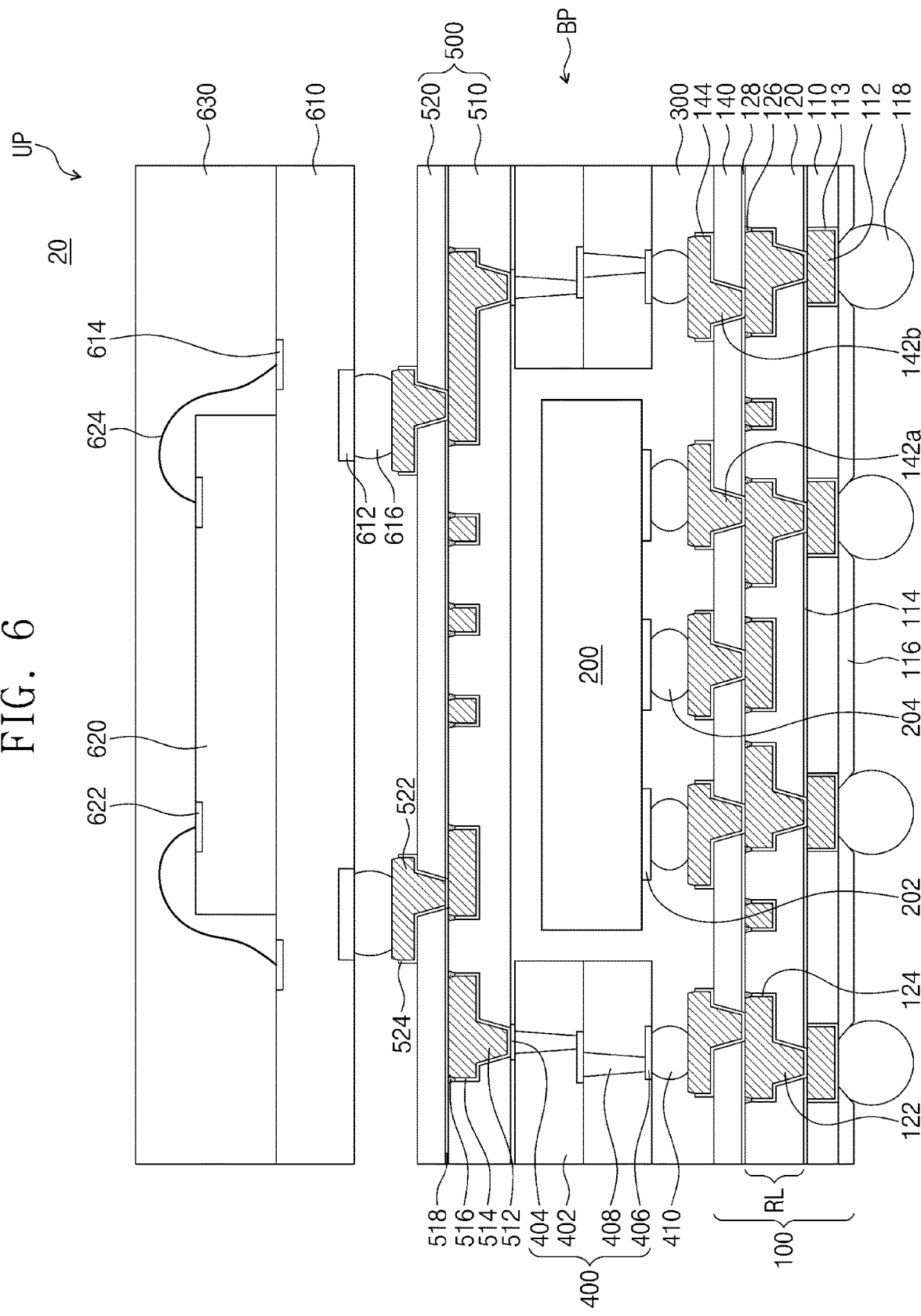

FIG. 6 is a cross-sectional view illustrating a semiconductor package including an interconnection structure according to some example embodiments of the present inventive concepts.

Referring to FIG. 6, a semiconductor package 20 may include a lower package BP and an upper package UP. For example, the semiconductor package 20 may be a package-on-package (PoP) in which the upper package UP is mounted on the lower package BP.

The lower package BP may be similar to the semiconductor package 10 discussed with reference to FIG. 5. For example, the lower package BP may include a lower redistribution substrate 100, a first semiconductor chip 200 mounted on the lower redistribution substrate 100, and a first molding member 300 lying on the lower redistribution substrate 100 and covering the first semiconductor chip 200.

In addition, the lower package BP may further include a connection substrate 400 and an upper redistribution substrate 500.

The connection substrate 400 may have an opening that penetrates therethrough. For example, the opening may be shaped like an open hole that connects top and bottom surfaces of the connection substrate 400. The bottom surface of the connection substrate 400 may be spaced apart from a top surface of the lower redistribution substrate 100. For example, the first molding member 300 and a connection substrate terminal 410 may be interposed between the bottom surface of the connection substrate 400 and the top surface of the lower redistribution substrate 100. The connection substrate 400 may include a base layer 402 and a conductive member (e.g., a conductor pattern) as an interconnection pattern provided in the base layer 402. For example, the base layer 402 may include silicon oxide. The conductive member may be disposed closer than the opening to an outer portion of the connection substrate 400. The conductive member may include upper pads 404, lower pads 406, and vias 408. The lower pads 406 may be disposed on a lower portion of the connection substrate 400. The vias 408 may penetrate the base layer 402, and may electrically connect the lower pads 406 to the upper pads 404.

The connection substrate 400 may be mounted on the lower redistribution substrate 100. For example, the connection substrate 400 may be electrically connected to third interconnection patterns 142*b* of the lower redistribution substrate 100 through connection substrate terminals 410 provided on the lower pads 406. For example, each of the connection substrate terminals 410 may contact a lower pad 406 at a top and a third interconnection pattern 142*b* at a bottom. Therefore, the connection substrate 400 may be electrically connected to the first semiconductor chip 200 and external terminals 118.

The first semiconductor chip 200 may be disposed on the lower redistribution substrate 100. The first semiconductor chip 200 may be disposed in the opening of the connection substrate 400. For example, the first semiconductor chip 200 may be electrically coupled to third interconnection patterns 142*a* through connection terminals 204 provided on the chip pads 202. For example, each of the connection terminals 204 may contact a chip pad 202 at a top and a third interconnection pattern 142*a* at a bottom.

The upper redistribution substrate 500 may be disposed on a top surface of the first molding member 300 and the top surface of the connection substrate 400. The upper redistribution substrate 500 may include a first upper dielectric layer 510, a first upper interconnection pattern 512 in the first upper dielectric layer 510, a first upper barrier layer 514 between the first upper dielectric layer 510 and the first upper interconnection pattern 512, and a second upper barrier layer 516 on the first upper barrier layer 514 and between the first upper dielectric layer 510 and the first upper interconnection pattern 512. The first upper dielectric layer 510, the first upper interconnection pattern 512, the first upper barrier layer 514, and the second upper barrier layer 516 may form a configuration the same as or similar to that of a redistribution layer RL of the lower redistribution substrate 100.

The upper redistribution substrate 500 may further include an upper passivation layer 518, a second upper dielectric layer 520 provided on the upper passivation layer 518, a second upper interconnection pattern 522 in the second upper dielectric layer 520, and a third upper barrier layer 524 that covers a lateral/bottom surface of the second upper interconnection pattern 522. The upper passivation layer 518, the second upper dielectric layer 520, the second upper interconnection pattern 522, and the third upper barrier layer 524 may be respectively configured identically or similarly to the passivation layer 128, the third dielectric layer 140, the third interconnection pattern 142a and 142b, and the fifth barrier layer 144 of the lower redistribution substrate 100.

The upper redistribution substrate 500 may be electrically coupled to the connection substrate 400. For example, the first upper interconnection patterns 512 of the upper redistribution substrate 500 may be electrically coupled to the upper pads 404 of the connection substrate 400. For example, first upper barrier layers 514 formed under the first upper interconnection patterns 512 may respectively contact the upper pads 404.

The upper package UP may be mounted on the lower package BP. The upper package UP may include an upper package substrate 610, a second semiconductor chip 620, and a second molding member 630. The upper package substrate 610 may be a printed circuit board (PCB). Alternatively, the upper package substrate 610 may be a redistribution substrate. For example, the upper package UP may be the same as the semiconductor package 10 discussed with reference to FIG. 5. A first upper substrate pad 612 may be disposed on a bottom surface of the upper package substrate 610.

The second semiconductor chip 620 may be disposed on the upper package substrate 610. The second semiconductor chip 620 may include integrated circuits, and the integrated circuits may include and/or be formed of a memory circuit, a logic circuit, or a combination thereof. The second semiconductor chip 620 may be of a different type from the first semiconductor chip 200. The second semiconductor chip 620 may have an upper chip pad 622 electrically connected through a bonding wire 624 to a second upper substrate pad 614 of the upper package substrate 610. FIG. 6 depicts that the second semiconductor chip 620 is mounted in a wire bonding manner, but the second semiconductor chip 620 may be mounted in various ways.

The upper package substrate 610 may be provided thereon with the second molding member 630 that covers the second semiconductor chip 620. The second molding member 630 may include and/or be formed of a dielectric polymer, such as an epoxy-based polymer.

A conductive terminal 616 may be disposed between the lower package BP and the upper package UP. The conductive terminal 616 may be interposed between and electrically connected to the first upper substrate pad 612 and the second upper interconnection pattern 522. Therefore, the upper package UP may be electrically connected to the first semiconductor chip 200 and the external terminal 118 through the conductive terminal 616, the upper redistribution substrate 500, and the connection substrate 400.

Figure 7:
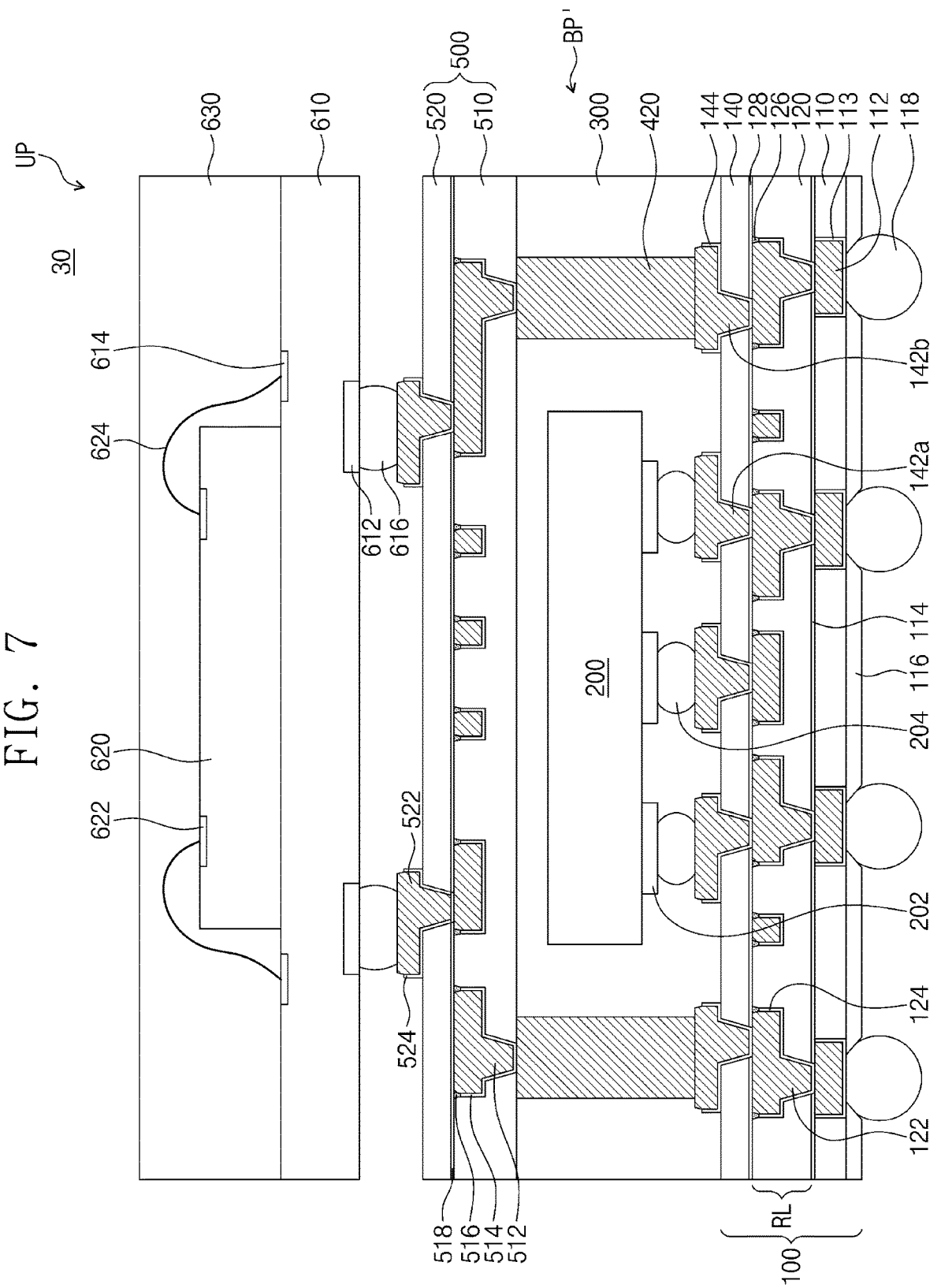

FIG. 7 is a cross-sectional view illustrating a semiconductor package including an interconnection structure according to some example embodiments of the present inventive concepts.

Referring to FIG. 7, a semiconductor package 30 may include a lower package BP' and an upper package UP. For example, the semiconductor package 30 may be a package-on-package (PoP) in which the upper package UP is mounted on the lower package BP'.

Compared to the semiconductor package 20 of FIG. 6, the connection substrate 400 may not be included in the lower package BP'. The lower package BP' may include a conductive via 420. The conductive via 420 may be laterally spaced apart from the first semiconductor chip 200. For example, a first molding member 300 may be interposed between the first semiconductor chip 200 and the conductive via 420. The conductive via 420 may vertically penetrate the first molding member 300. The conductive via 420 may be electrically coupled to (e.g., contact) the third interconnection pattern 142b. The conductive via 420 may be electrically connected through the lower redistribution substrate 100 to the external terminal 118 or the first semiconductor chip 200. The conductive via 420 may be electrically coupled to the first upper interconnection pattern 512 of the upper redistribution substrate 500. For example, a first upper barrier layer 514 formed under a first upper interconnection pattern 512 may contact the conductive via 420.

The conductive via 420 may include and/or be a metal pillar.

FIGS. 8 to 21 are cross-sectional views illustrating a method of fabricating an interconnection structure according to some example embodiments of the present inventive concepts. FIG. 15 is an enlarged view illustrating section R of FIG. 14.

Figure 8:
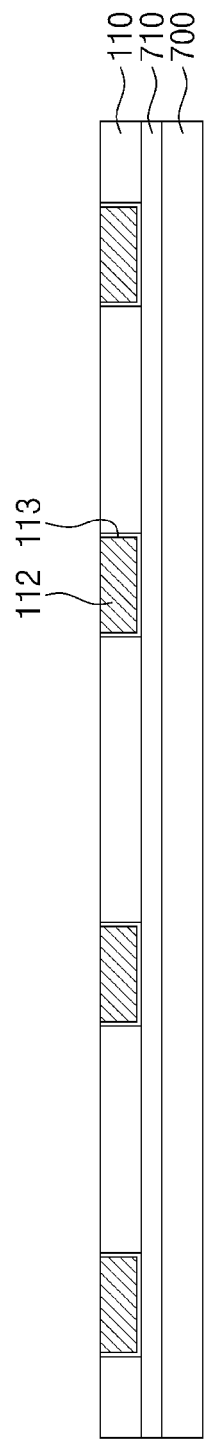

Referring to FIG. 8, a carrier substrate 700 may be provided. The carrier substrate 700 may be a dielectric substrate including and/or formed of glass or polymer, or may be a conductive substrate including and/or formed of metal. The carrier substrate 700 may be provided with an adhesive member 710 (e.g., an adhesive) on a top surface of the carrier substrate 700. For example, the adhesive member 710 may include and/or be a glue tape.

A lower dielectric layer 110 may be provided on the carrier substrate 700. The lower dielectric layer 110 may include and/or be formed of a dielectric polymer or a photosensitive polymer.

Substrate pads 112 may be formed in the lower dielectric layer 110. For example, the lower dielectric layer 110 may be patterned to form openings in which the substrate pads 112 will be formed, a seed/barrier layer 113 may be conformally formed on lateral and bottom surfaces of the openings, and a plating process may be performed in which the seed/barrier layer 113 is used as a seed to form the substrate pads 112 that fill the openings.

Alternatively, a seed/barrier layer 113 may be formed on the carrier substrate 700, a sacrificial layer may be formed on the seed/barrier layer 113, the sacrificial layer may be patterned to form openings in which the substrate pads 112 will be formed, and a plating process may be performed in which the seed/barrier layer 113 in the opening is used as a seed to form the substrate pads 112 that fill the openings. Afterwards, the sacrificial layer may be removed, and the substrate pads 112 may be used as a mask to pattern the seed/barrier layer 113. Therefore, the seed/barrier layer 113 may remain between the carrier substrate 700 and each of the substrate pads 112. After that, the lower dielectric layer 110 may be formed on the carrier substrate 700, surrounding the substrate pads 112.

Figure 9:
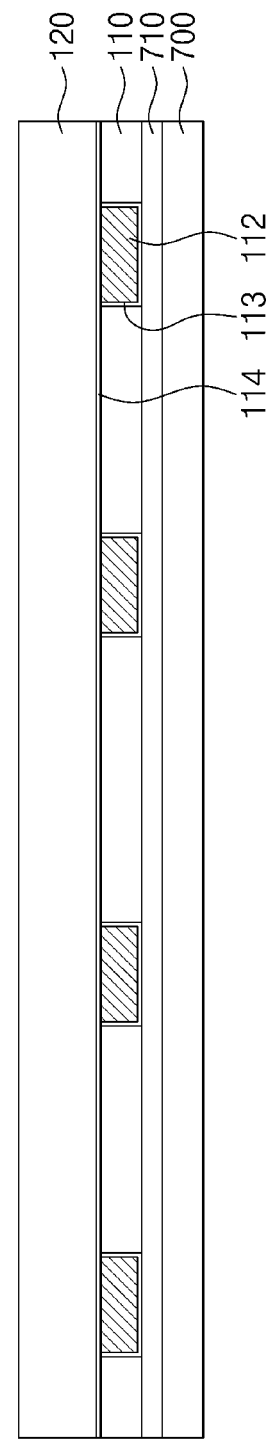

Referring to FIG. 9, a substrate passivation layer 114 may be formed on the lower dielectric layer 110. The substrate passivation layer 114 may be formed by depositing a dielectric material on the lower dielectric layer 110. The deposition process may include and/or be a chemical vapor deposition (CVD) process. The substrate passivation layer 114 may include and/or be formed of silicon nitride (SiN).

A first dielectric layer 120 may be formed on the substrate passivation layer 114. The first dielectric layer 120 may be formed by a coating process, such as spin coating or slit coating. The first dielectric layer 120 may include and/or be formed of a photosensitive polymer or a photo-imageable dielectric (PID). The photosensitive polymer may include, for example, one or more of photosensitive polyimide, polybenzoxazole (PBO), phenolic polymers, and benzocyclobutene polymers.

Figure 10:
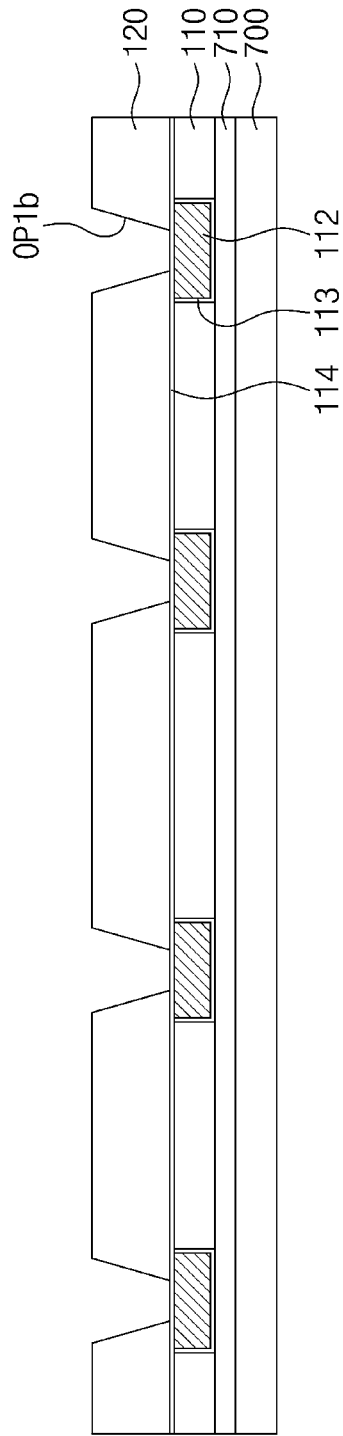

Referring to FIG. 10, the first dielectric layer 120 may be patterned to form first preliminary openings OP1b. The first preliminary openings OP1b may expose the substrate passivation layer 114. The patterning of the first dielectric layer 120 may be performed by an exposure and a development processes. The exposure process may be a negative tone exposure process or a positive tone exposure process. Afterwards, a cure process may be performed on the first dielectric layer 120. The first preliminary openings OP1b may be formed to have their horizontal widths that decreases in a vertical direction approaching the carrier substrate 700.

Figure 11:
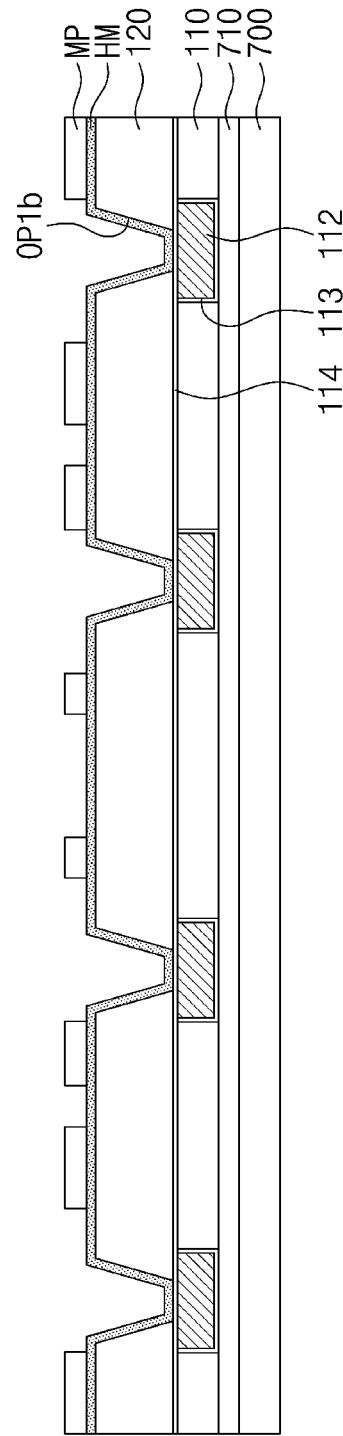

Referring to FIG. 11, a hardmask layer HM may be formed to cover top and lateral surfaces of the first dielectric layer 120 that are exposed to the first preliminary openings OP1b. The hardmask layer HM may cover an exposed top surface of the substrate passivation layer 114. The hardmask layer HM may include and/or be formed of a metallic material having an etch selectivity with respect to the first dielectric layer 120. The hardmask layer HM may include and/or be formed of metal, such as titanium (Ti) or tantalum (Ta). The hardmask layer HM may be formed by, for example, chemical vapor deposition (CVD), physical vapor deposition (PVD), or atomic layer deposition (ALD).

Mask patterns MP may be formed on the hardmask layer HM. For example, a photoresist layer may be formed on the hardmask layer HM. The photoresist layer may be formed by a coating process, such as spin coating or slit coating. The photoresist layer may include and/or be formed of an organic material, such as a polymer. The mask patterns MP may be formed by a patterning process performed on the photoresist layer. The patterning process may include an exposure and a development processes. The mask patterns MP may partially expose the hardmask layer HM. For example, opening portions of the mask patterns MP may vertically overlap the first preliminary openings OP1b.

Referring to FIG. 12, the hardmask layer HM and the first dielectric layer 120 may undergo a dry etching process in which the mask patterns MP are used as an etching mask. For example, the hardmask layer HM exposed by the mask patterns MP may be etched by the etching process. After the hardmask layer HM is etched, the first dielectric layer 120 below the hardmask layer HM may be partially etched. The hardmask layer HM that vertically overlaps the mask pattern MP may not be etched.

As portions of the first dielectric layer 120 that are covered with the hardmask layer HM are etched, upper parts OP1a of the first openings OP1 may be formed at an upper portion of the first dielectric layer 120. The etching process may be executed not to fully penetrate the first dielectric layer 120. For example, an upper portion of the first dielectric layer 120 exposed by the mask patterns MP may be removed by the etching process and a lower portion thereof may remain. The first preliminary openings OP1b remaining on a lower portion of the first dielectric layer 120 may correspond to lower parts OP1b of the first openings OP1.

Referring to FIG. 13, the mask patterns MP and the hardmask layer HM may be removed. An ashing process may be used to remove the mask patterns MP and the hardmask layer HM. The removal of the mask patterns MP and the hardmask layer HM may expose the top surface of the first dielectric layer 120.

A preliminary barrier layer 125 and a conductive layer 123 may be formed on the first dielectric layer 120. The preliminary barrier layer 125 may be formed to conformally cover the top surface of the first dielectric layer 120, inner lateral surfaces of the first openings OP1, and bottom surfaces of the first openings OP1. The preliminary barrier layer 125 may include and/or be formed of titanium (Ti), tantalum (Ta), titanium nitride (TiN), or tantalum nitride (TaN).

The conductive layer 123 may be formed on the preliminary barrier layer 125, thereby filling the first openings OP1 and covering the top surface of the first dielectric layer 120. The conductive layer 123 may be formed by performing an electroplating process in which the preliminary barrier layer 125 is used as a seed. Alternatively, the conductive layer 123 may be formed by forming a seed layer (not shown) on the preliminary barrier layer 125, and then performing a plating process in which the seed layer is used as a seed. The conductive layer 123 may include and/or be formed of a metal, such as copper, and may extend onto the top surface of the first dielectric layer 120.

Figure 14:
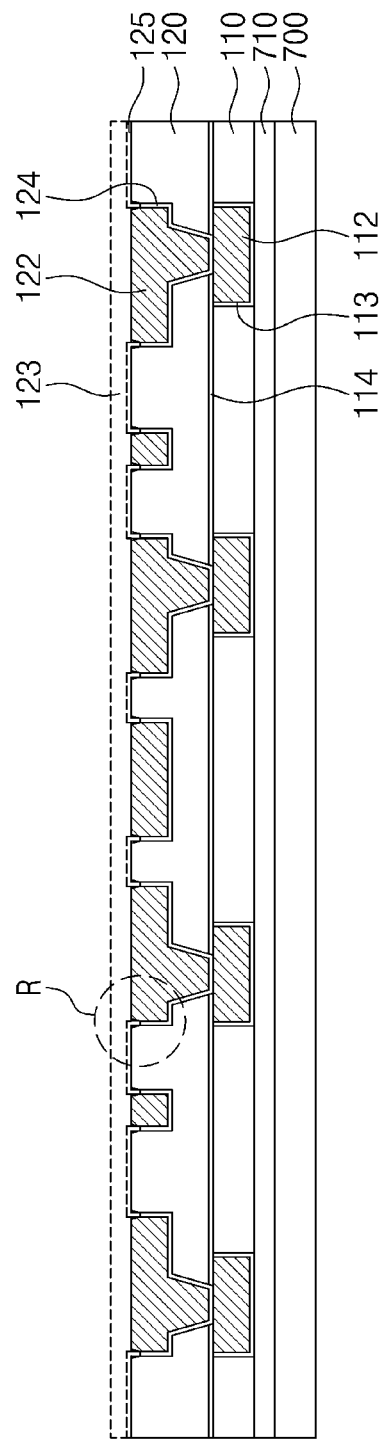
Figure 15:
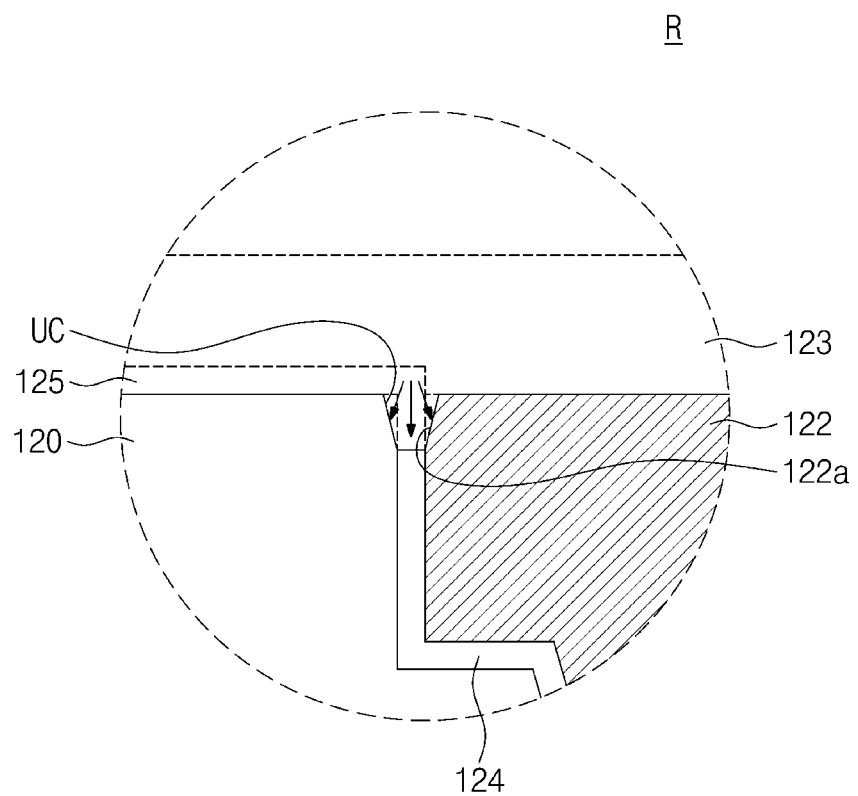

Referring to FIG. 14, the preliminary barrier layer 125 and the conductive layer 123 may undergo a planarization process to form first barrier layers 124 and first interconnection patterns 122. The planarization process may include and/or be, for example, a chemical mechanical polishing (CMP) process. The planarization process may continue until the top surface of the first dielectric layer 120 is exposed. During the planarization process, the first barrier layer 124 may be formed to have a top surface lower than the top surface of the first dielectric layer 120. A description thereof will be discussed in detail with reference to FIG. 15.

Referring to FIG. 15, the preliminary barrier layer 125 and the conductive layer 123 may undergo a planarization process to selectively remove the preliminary barrier layer 125 and the conductive layer 123 from the top surface of the first dielectric layer 120. In a chemical mechanical polishing process adopted as the planarization process, the preliminary barrier layer 125 and the conductive layer 123 may be physically polished and also chemically polished with an etching solution. In this case, the etching solution may etch the preliminary barrier layer 125 faster than the conductive layer 123 and the first dielectric layer 120, and as indicated by arrows shown in FIG. 15, the etching solution may enter into a gap between the first dielectric layer 120 and the first interconnection pattern 122 to thereby etch the first barrier layer 124. Therefore, the first barrier layer 124 may be formed to have a top surface at a lower level than that of the top surface of the first dielectric layer 120 and that of a top surface of the first interconnection pattern 122, and the first dielectric layer 120 and the first interconnection pattern 122 may have therebetween an undercut region UC defined by the first dielectric layer 120, the first interconnection pattern 122, and the first barrier layer 124.

The formation of the undercut region UC may expose a corner of the first dielectric layer 120 and a corner of the first interconnection pattern 122. The corners may experience strong pressure during physical polishing of chemical mechanical polishing, and may be etched to form inclined surfaces. For example, the first interconnection pattern 122 may be formed to have an inclined surface 122a adjacent to the top surface thereof at a boundary with the undercut region UC. The under-cut region UC may have a horizontal width that decreases in a vertical direction approaching the first barrier layer 124 from the top surface of the first dielectric layer 120.

Referring to FIG. 16, a second barrier layer 126 may be formed in the under-cut region UC. For example, a material layer may be formed to fill the undercut region UC and on the first dielectric layer 120, and then the material layer may be selectively removed from the first dielectric layer 120 so as to allow the material layer to remain only in the undercut region UC. The material layer may include and/or be formed of a metallic material whose ionization tendency is greater than that of a material included in and/or forming the first interconnection pattern 122. In this case, the material may be formed by performing a plating process. Alternatively, the material layer may include and/or be formed of a dielectric material, such as silicon nitride (SiN). In this case, the material layer may be formed by performing a deposition process, such as chemical vapor deposition (CVD).

Referring to FIG. 17, a passivation layer 128 may be formed on the first dielectric layer 120. The passivation layer 128 may be formed by depositing a dielectric material on the first dielectric layer 120. A chemical vapor deposition (CVD) process may be performed to deposit the dielectric material. The passivation layer 128 may be formed to cover the top surface of the first dielectric layer 120, a top surface of the second barrier layer 126, and the top surface of the first interconnection pattern 122. The passivation layer 128 may include and/or be formed of silicon nitride (SiN). Therefore, the first interconnection pattern 122 may be surrounded by the first barrier layer 124, the second barrier layer 126, and the passivation layer 128, may be spaced apart from the first dielectric layer 120 and a third dielectric layer 140 which will be discussed below, and may be prevented from receiving oxygen from the first dielectric layer 120 and a third dielectric layer 140 which will be discussed below. The processes mentioned above may form a redistribution layer RL of an interconnection structure.

Differently from the description of FIGS. 16 and 17, the second barrier layer 126 may be formed to cover the top surface of the first interconnection pattern 122.

Referring to FIG. 18, the second barrier layer 126 may be formed in the undercut region UC and on the top surface of the first interconnection pattern 122. For example, a plating process may be performed in which the first interconnection pattern 122 is used as a seed. In the plating process, a metallic material may be deposited on the top surface of the first interconnection pattern 122 and the inclined surface (see 122a of FIG. 15) of the first interconnection pattern 122, thereby forming the second barrier layer 126. The metallic material may have an ionization tendency greater than that of the first interconnection pattern 122. For example, the metallic material may include and/or may be nickel (Ni). Therefore, the first interconnection pattern 122 may be surrounded by the first barrier layer 124 and the second barrier layer 126. The second barrier layer 126 may have a portion, which has the same role as that of the passivation layer 128, positioned on the top surface of the first interconnection pattern 122, and the formation of the passivation layer 128 discussed with reference to FIG. 17 may be omitted. In this case, an interconnection structure may be manufactured as shown in FIG. 3.

In some example embodiments, referring to FIG. 19, the passivation layer 128 may be formed in the undercut region UC and on the top surface of the first interconnection pattern 122. For example, a dielectric material may be introduced into the undercut region UC, and may further be deposited on the first dielectric layer 120 and the first interconnection pattern 122, thereby forming the passivation layer 128. The deposition of the dielectric material may be performed by a deposition process, such as chemical vapor deposition (CVD). The dielectric material may be introduced into the undercut region UC, and the passivation layer 128 may be formed to have a recess RS on the undercut region UC. The dielectric material may include and/or may be silicon nitride (SiN). Therefore, the first interconnection pattern 122 may be surrounded by the first barrier layer 124 and the passivation layer 128. The passivation layer 128 may have a portion positioned in the undercut region UC, and the portion may have the same role as that of the second barrier layer 126. In this case, an interconnection structure may be manufactured as shown in FIG. 4.

Figure 20:
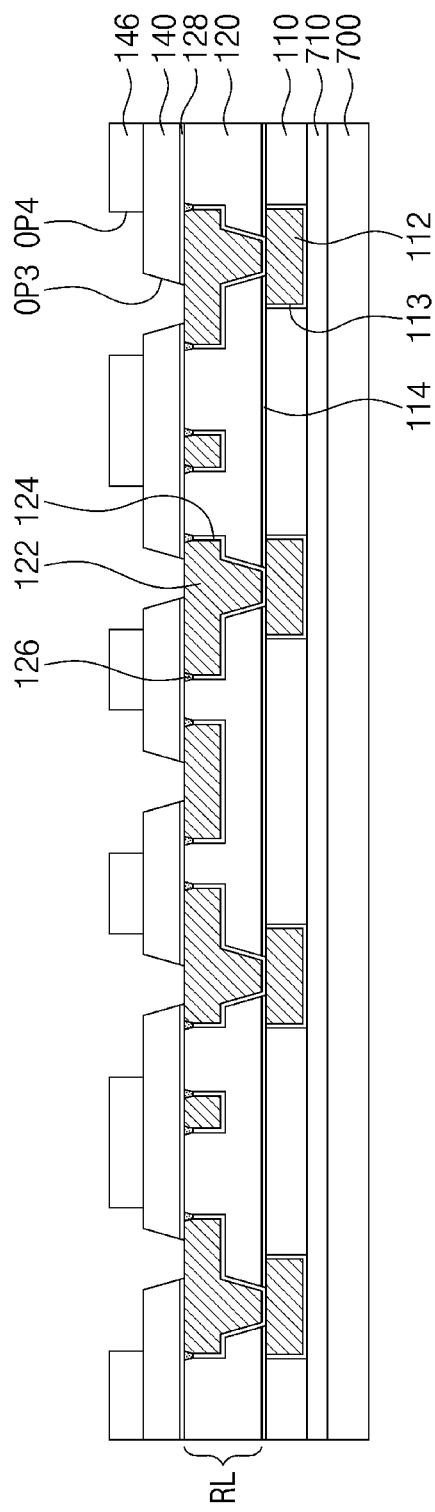

Referring to FIG. 20, a third dielectric layer 140 and a fourth dielectric layer 146 may be sequentially formed on the first dielectric layer 120. Each of the third and fourth dielectric layers 140 and 146 may be formed by a coating process, such as a spin coating or a slit coating. Each of the third and fourth dielectric layers 140 and 146 may include and/or be formed of a photosensitive polymer or a photo-imageable dielectric (PID). For example, the photosensitive polymer may include one or more of photosensitive polyimide, polybenzoxazole (PBO), phenolic polymers, and benzocyclobutene polymers. The third and fourth dielectric layers 140 and 146 may include and/or be formed of different materials from each other.

Third openings OP3 may be formed in the third dielectric layer 140, and fourth openings OP4 may be formed in the fourth dielectric layer 146. The formation of the third and fourth openings OP3 and OP4 may be the same as or similar to the formation of the first openings OP1 discussed with reference to FIGS. 10 to 12. For example, the third and fourth dielectric layers 140 and 146 may be patterned to form the third openings OP3, a mask pattern may be formed on the fourth dielectric layer 146, and then the fourth dielectric layer 146 may be patterned to form the fourth openings OP4. In the patterning process forming the third openings OP3, the passivation layer 128 may also be etched to expose the top surface of the first interconnection pattern 122. Afterward, the mask pattern may be removed. In some embodiments, the third and fourth openings OP3 and OP4 may be formed by a process similar to forming openings in a known dual damascene fabrication process.

Figure 21:
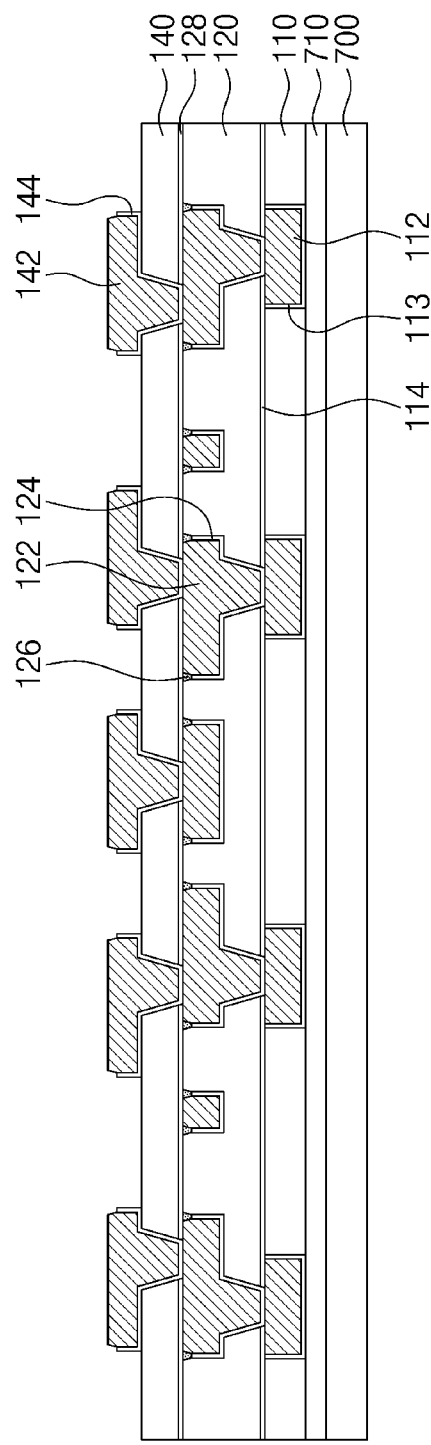

Referring to FIG. 21, third interconnection patterns 142 may be formed. For example, a preliminary barrier layer and a conductive layer may be formed on the third and fourth dielectric layers 140 and 146 so as to fill the third and fourth openings OP3 and OP4, and then the preliminary barrier layer and the conductive layer may undergo a planarization process to form the third interconnection patterns 142 and fifth barrier layers 144.

Thereafter, the fourth dielectric layer 146 may be removed. Therefore, the third interconnection pattern 142 may have a portion positioned on/above the third dielectric layer 140, and the portion positioned above the third dielectric layer 140 may serve as a pad of an interconnection structure.

The processes mentioned above may form an interconnection structure 100, e.g., illustrated in FIG. 7, etc. FIGS. 8 to 21 depict the fabrication of the interconnection structure 100 that has a single redistribution layer RL, but the present inventive concepts are not limited thereto. When forming an interconnection structure with a plurality of redistribution layers, the processes discussed with reference to FIGS. 9 to 17 may be repeatedly performed on a resultant structure of FIG. 17.

Figure 22:
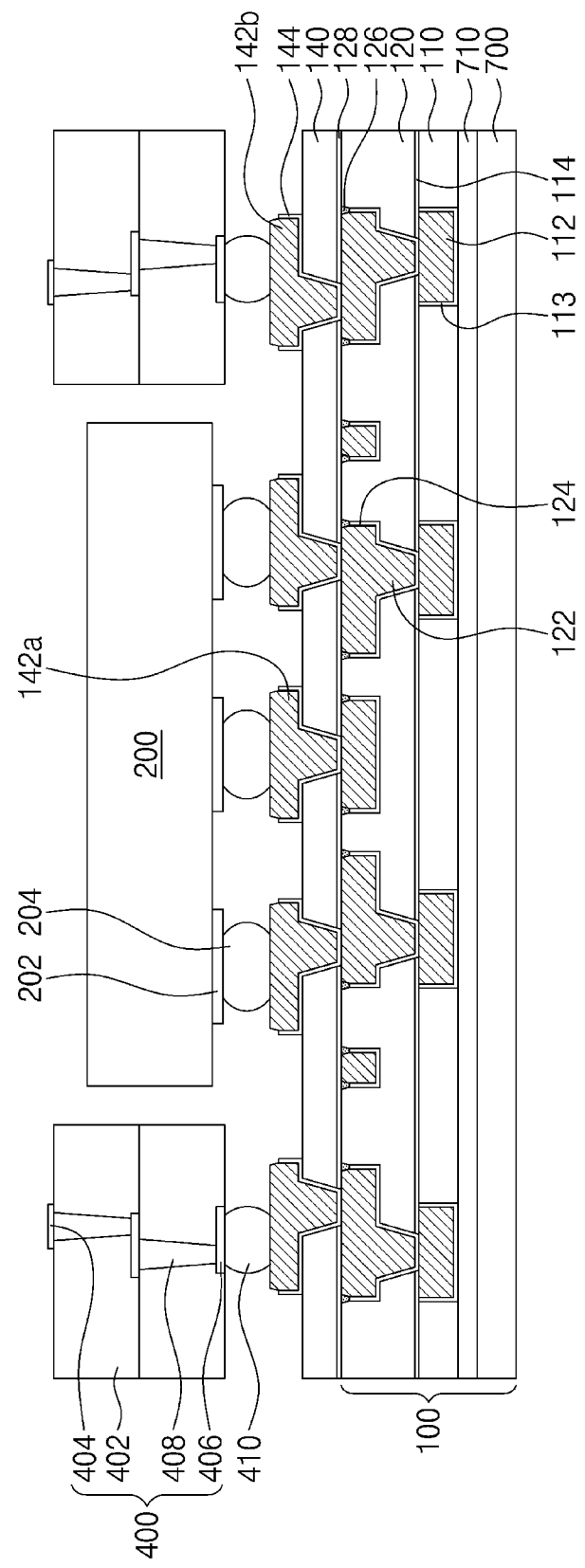
FIGS. 22 to 24 are cross-sectional views illustrating a method of fabricating a semiconductor package that includes an interconnection structure according to some example embodiments of the present inventive concepts.

FIG. 22 is a cross-sectional view illustrating a method of fabricating a semiconductor package that includes an interconnection structure according to some example embodiments of the present inventive concepts.

Referring to FIG. 22, a first semiconductor chip 200 and a connection substrate 400 may be mounted on a resultant structure of FIG. 21. For example, the interconnection structure 100 fabricated as shown in FIGS. 8 to 17 may be used as a lower redistribution substrate 100 for a semiconductor package.

The connection substrate 400 may have an opening that penetrates therethrough. The connection substrate 400 may be mounted on the lower redistribution substrate 100. For example, connection substrate terminals 410 may be provided on lower pads 406 of the connection substrate 400. The connection substrate 400 may be aligned to allow the connection substrate terminals 410 to rest on third interconnection patterns 142b, and then a reflow process may be performed to connect the connection substrate terminals 410 to the third interconnection patterns 142b and the lower pads 406.

The first semiconductor chip 200 may be mounted in a flip-chip manner. For example, connection terminals 204 may be provided on chip pads 202 of the first semiconductor chip 200. The first semiconductor chip 200 may be disposed to rest in the opening of the connection substrate 400. The first semiconductor chip 200 may be aligned to allow the connection terminals 204 to rest on third interconnection patterns 142a, and then a reflow process may be performed to connect the connection terminals 204 to the third interconnection patterns 142a and the chip pads 202.

Referring back to FIG. 6, a first molding member 300 may be formed on the lower redistribution substrate 100. The first molding member 300 may fill a space between the connection substrate 400 and the first semiconductor chip 200. For example, a dielectric member may be introduced into a space between the connection substrate 400 and the first semiconductor chip 200, e.g., in the opening penetrating the connection substrate 400, and then the dielectric member may be cured to form the first molding member 300.

An upper redistribution substrate 500 may be formed on the first molding member 300. The formation of the upper redistribution substrate 500 may be similar to the formation of the lower redistribution substrate 100. For example, a first upper dielectric layer 510 may be formed on the first molding member 300 and the connection substrate 400, openings may be formed to penetrate the first upper dielectric layer 510 and to expose upper pads 404 of the connection substrate 400, and then a first upper interconnection pattern 512, a first upper barrier layer 514, and a second upper barrier layer 516 may be formed in each of the openings. An upper passivation layer 518 and a second upper dielectric layer 520 may be formed on the first upper dielectric layer 510, openings may be formed to penetrate the second upper dielectric layer 520 and the upper passivation layer 518, and then a second upper interconnection pattern 522 and a third upper barrier layer 524 may be formed in each of the openings. The processes mentioned above may form a lower package BP.

An upper package UP may be mounted on the lower package BP. The upper package UP may include an upper package substrate 610, a second semiconductor chip 620, and a second molding member 630. A conductive terminal 616 may be used to mount the upper package UP on the lower package BP.

Afterwards, the carrier substrate 700 and the adhesive member 710 may be removed to expose a bottom surface of the lower redistribution substrate 100. A protective layer 116 may be formed on the bottom surface of the lower redistribution substrate 100. The protective layer 116 may be patterned to expose the substrate pads 112, e.g., in case the seed/barrier layer 113 is not formed under the bottom surfaces of the substrate pads 112. For example, the seed/barrier layer 113 may be exposed through opening formed in the protective layer 116 in case the seed/barrier layer 113 is formed under the bottom surfaces of the substrate pads 112. External terminals 118 may be provided on the substrate pads 112 or on the seed/barrier layer 113.

The processes discussed above may fabricate a semiconductor package 20 discussed with reference to FIG. 6.

Figure 23:
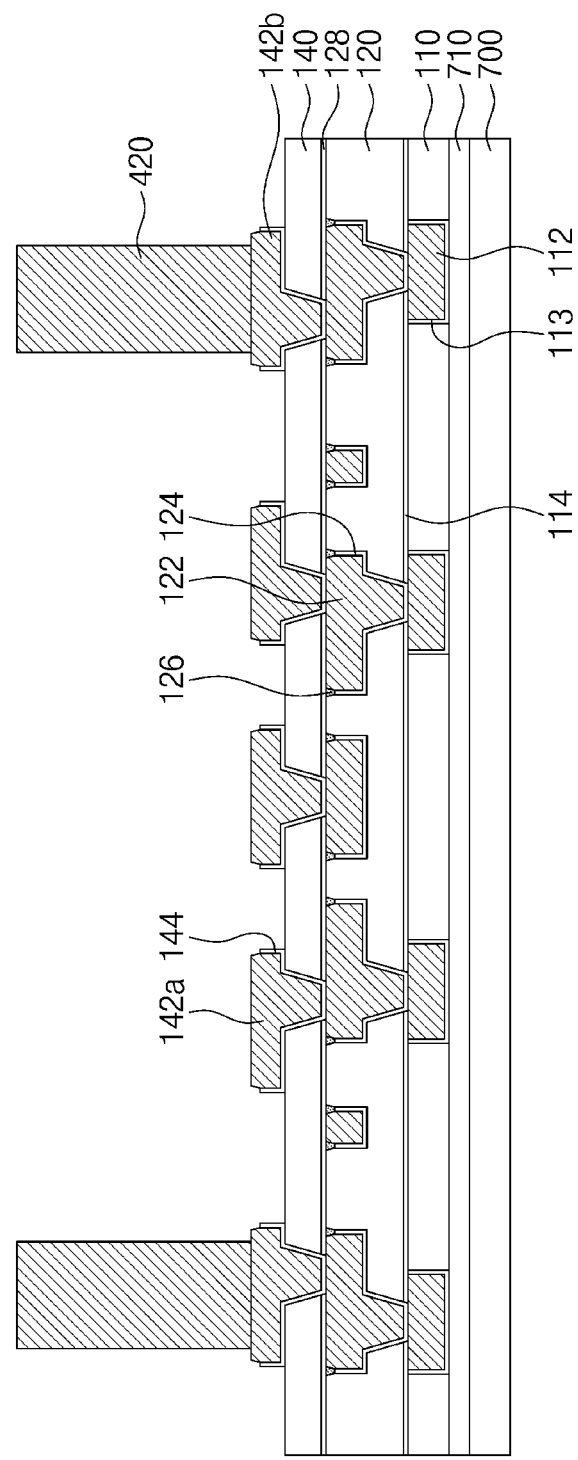
Figure 24:
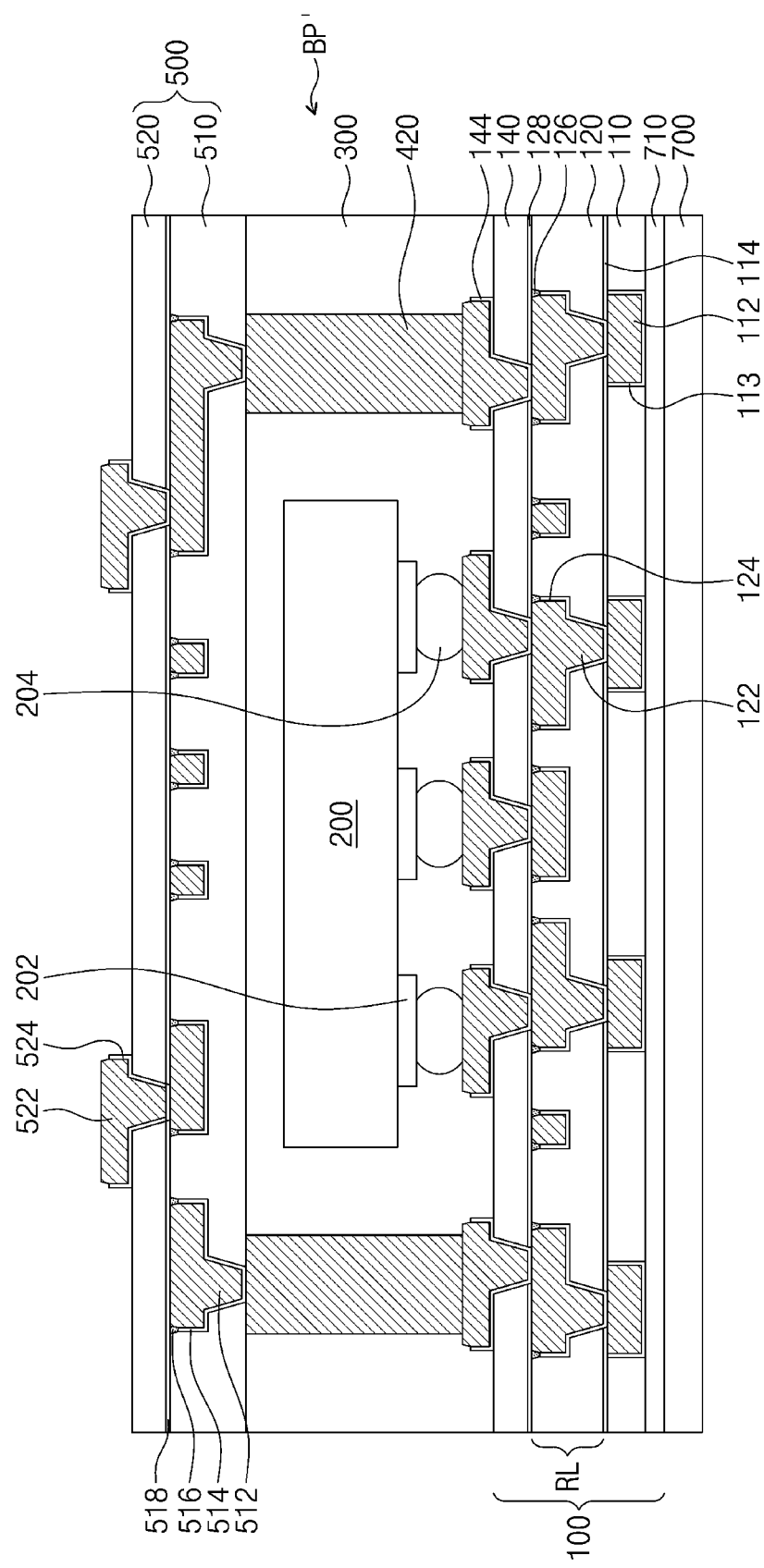

FIGS. 23 and 24 are cross-sectional views illustrating a method of fabricating a semiconductor package that includes an interconnection structure according to some example embodiments of the present inventive concepts.

Referring to FIG. 23, a conductive via 420 may be formed on a resultant structure of FIG. 21. The interconnection structure 100 fabricated as shown in FIGS. 8 to 17 may be used as a lower redistribution substrate 100 for a semiconductor package.

The conductive via 420 may be formed on the lower redistribution substrate 100. For example, a sacrificial layer may be formed on the lower redistribution substrate 100, a via hole may be formed to penetrate the sacrificial layer and to expose a third interconnection pattern 142b, and then the via hole may be filled with a conductive material to form the conductive via 420. The sacrificial layer may be subsequently removed.

Referring to FIG. 24, a first semiconductor chip 200 may be mounted on the lower redistribution substrate 100. The first semiconductor chip 200 may be mounted in a flip-chip manner. For example, connection terminals 204 may be provided on chip pads 202 of the first semiconductor chip 200. The first semiconductor chip 200 may be aligned to allow the connection terminals 204 to rest on third interconnection patterns 142a, and then a reflow process may be performed to connect the connection terminals 204 to the third interconnection patterns 142a and the chip pads 202.

A first molding member 300 may be formed on the lower redistribution substrate 100. The first molding member 300 may cover the first semiconductor chip 200 and may surround the conductive via 420. For example, a dielectric member (e.g., a dielectric layer) may be coated on the lower redistribution substrate 100 so as to cover the first semiconductor chip 200 and the conductive via 420, and then the dielectric member may be cured to form the first molding member 300. Thereafter, the first molding member 300 may undergo a planarization process to expose a top surface of the conductive via 420.

An upper redistribution substrate 500 may be formed on the first molding member 300. The formation of the upper redistribution substrate 500 may be similar to the formation of the lower redistribution substrate 100. For example, a first upper dielectric layer 510 may be formed on the first molding member 300, an opening may be formed to penetrate the first upper dielectric layer 510 and to expose the conductive via, and then a first upper interconnection pattern 512, a first upper barrier layer 514, and a second upper barrier layer 516 may be formed in the opening. An upper passivation layer 518 and a second upper dielectric layer 520 may be formed on the first upper dielectric layer 510, openings may be formed to penetrate the second upper dielectric layer 520 and the upper passivation layer 518, and then a second upper interconnection pattern 522 and a third upper barrier layer 524 may be formed in each of the openings. The processes mentioned above may form a lower package BP'.

Referring back to FIG. 7, an upper package UP may be mounted on the lower package BP'. The upper package UP may include an upper package substrate 610, a second semiconductor chip 620, and a second molding member 630. A conductive terminal 616 may be used to mount the upper package UP on the lower package BP'.

Afterwards, the carrier substrate 700 and the adhesive member 710 may be removed to expose a bottom surface of the lower redistribution substrate 100. A protective layer 116 may be formed on the bottom surface of the lower redistribution substrate 100. The protective layer 116 may be patterned to expose the substrate pads 112, e.g., in case a seed/barrier layer 113 is not formed under the bottom surfaces of the substrate pads 112. For example, the seed/barrier layer 113 may be exposed through opening formed in the protective layer 116 in case the seed/barrier layer 113 is formed under the bottom surfaces of the substrate pads 112. External terminals 118 may be provided on the substrate pads 112 or on the seed/barrier layer 113.

The processes discussed above may fabricate a semiconductor package 30 discussed with reference to FIG. 7.

According to some example embodiments of the present inventive concepts, since an interconnection structure includes an additional barrier layer to surround an upper portion of an interconnection pattern, oxygen may be prevented from diffusing into the interconnection pattern from a dielectric layer in which the interconnection pattern is provided or from another dielectric layer disposed on the dielectric layer, and the interconnection pattern may be prevented/protected from being damaged.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A method of fabricating a semiconductor package, the method comprising:
    forming a lower dielectric layer and a substrate pad in the lower dielectric layer;
    forming a first dielectric layer on the lower dielectric layer;
    patterning the first dielectric layer to form an opening;
    forming on the first dielectric layer a preliminary barrier layer conformally covering a top surface of the first dielectric layer, and inner lateral surface and a bottom surface of the opening;
    forming on the preliminary barrier layer a conductive layer filling the opening and covering the top surface of the first dielectric layer;
    performing a planarization process on the preliminary barrier layer and the conductive layer to form a first barrier layer and an interconnection pattern such that the top surface of the first dielectric layer is exposed, wherein during the planarization process the first barrier layer is formed to have a top surface lower than the top surface of the first dielectric layer;
    forming a second barrier layer in an undercut region which is defined by the first dielectric layer, the interconnection pattern, and the first barrier layer;
    forming a passivation layer on the second barrier layer and the interconnection pattern;
    forming on the passivation layer and the first dielectric layer a second dielectric layer and pads penetrating the second dielectric layer to connect with the interconnection pattern; and
    mounting a first semiconductor chip and a connection substrate on the pads.

2. The method of claim 1, wherein a top surface of the second barrier layer is coplanar with the top surface of the first dielectric layer.

3. The method of claim 1, wherein a first inner lateral surface of the undercut region is inclined toward the top surface of the first dielectric layer and a second inner lateral surface of the undercut region is inclined toward a top surface of the interconnection pattern, the first and second inner lateral surfaces respectively exposing the first dielectric layer and the interconnection pattern.

4. The method of claim 1, wherein a height of the second barrier layer is in a range of about 10 nm to about 20 nm.

5. The method of claim 1, wherein the passivation layer extends to between the first dielectric layer and the second dielectric layer,
    wherein the passivation layer covers the top surface of the first dielectric layer, a top surface of the interconnection pattern, and a top surface of the second barrier layer, and
    wherein the pads penetrate the passivation layer and is electrically coupled to the interconnection pattern.

6. The method of claim 1, wherein
    the second barrier layer includes a material the same as a material included in the passivation layer, and
    the second barrier layer and the passivation layer are integrally connected into a single piece.

7. The method of claim 6, wherein a portion of a top surface of the passivation layer includes a recess that is concave toward the first barrier layer, the recess of the top surface being positioned on the second barrier layer.

8. The method of claim 1, wherein
    the first dielectric layer and the second dielectric layer are directly contact each other beside the interconnection pattern, and
    the second barrier layer and the passivation layer are integrally connected into a single piece on a top surface of the interconnection pattern.

9. The method of claim 1, wherein the second barrier layer includes a metallic material whose ionization tendency is greater than an ionization tendency of a metallic material included in the interconnection pattern.

10. A method of fabricating a semiconductor package, the method comprising:
    forming a lower dielectric layer and a substrate pad in the lower dielectric layer;
    forming a first dielectric layer on the lower dielectric layer;
    patterning the first dielectric layer to form an opening;

forming on the first dielectric layer a preliminary barrier layer conformally covering a top surface of the first dielectric layer, and inner lateral surface and a bottom surface of the opening;

forming on the preliminary barrier layer a conductive layer filling the opening and covering the top surface of the first dielectric layer;

performing a planarization process on the preliminary barrier layer and the conductive layer to form a barrier layer and an interconnection pattern such that the top surface of the first dielectric layer is exposed, wherein during the planarization process the barrier layer is formed to have a top surface lower than the top surface of the first dielectric layer;

forming a passivation layer on the first dielectric layer and the interconnection pattern, the passivation layer fills an undercut region which is defined by the first dielectric layer, the interconnection pattern, and the barrier layer; and forming on the passivation layer and the first dielectric layer a second dielectric layer and pads penetrating the second dielectric layer to connect with the interconnection pattern, wherein the passivation layer extends between the first dielectric layer and the around dielectric layer, wherein the passivation layer covers the top surface of the first dielectric layer, and a top surface of the interconnection pattern, and wherein during the forming of the second dielectric layer a top surface of the passivation layer is at a higher vertical level, than the top surface of the first dielectric layer.

11. The method of claim 10, wherein a depth of the undercut region is in a range of about 10 nm to about 20 nm.

12. The method of claim 10, wherein a first inner lateral surface of the undercut region is inclined toward the top surface of the first dielectric layer and a second inner lateral surface of the undercut region is inclined toward a top surface of the interconnection pattern, the first and second inner lateral surfaces respectively exposing the first dielectric layer and the interconnection pattern.

13. The method of claim 10, wherein a portion of a top surface of the passivation layer includes a recess that is concave toward the barrier layer, the recess of the top surface being positioned on the undercut region.

14. The method of claim 10,
wherein the pads penetrate the passivation layer and is electrically coupled to the interconnection pattern.

15. The method of claim 10,
wherein the interconnection pattern includes:
a head part in an upper portion of the first dielectric layer, the head part exposed on the top surface of the first dielectric layer; and
a tail part that has a horizontal width less than a horizontal width of the head part, the tail part extending downwardly from the head part and being exposed on a bottom surface of the first dielectric layer, and
wherein the first dielectric layer includes a photosensitive polymer or a photo-imageable dielectric (PID).

16. A method of fabricating a semiconductor package, the method comprising:

forming a lower dielectric layer and a substrate pad in the lower dielectric layer;

forming a first dielectric layer on the lower dielectric layer;

patterning the first dielectric layer to form an opening;

forming on the first dielectric layer a first preliminary barrier layer conformally covering a top surface of the first dielectric layer, and inner lateral surface and a bottom surface of the opening;

forming on the first preliminary barrier layer a conductive layer filling the opening and covering the top surface of the first dielectric layer;

performing a planarization process on the first preliminary barrier layer and the conductive layer to form a first barrier layer and an interconnection pattern such that the top surface of the first dielectric layer is exposed, wherein during the planarization process the first barrier layer is formed to have a top surface lower than the top surface of the first dielectric layer;

forming a second preliminary barrier layer covering the top surface of the first dielectric layer and a top surface of the interconnection pattern and filling an undercut region which is defined by the first dielectric layer, the interconnection pattern, and the first barrier layer;

removing a portion of the second preliminary barrier layer on the top surface of the first dielectric layer and the top surface of the interconnection pattern to form a second barrier layer in the undercut region, forming a passivation layer on the second barrier layer, the interconnection pattern and the first dielectric layer, and forming on the passivation layer and the first dielectric layer a second dielectric layer, wherein the passivation layer extends between the interconnection pattern and the second dielectric layer, and wherein the passivation layer contacts the interconnection pattern.

17. The method of claim 16,
wherein a top surface of the second barrier layer is coplanar with the top surface of the first dielectric layer.

18. The method of claim 17,
wherein the passivation layer covers the top surface of the first dielectric layer, the top surface of the interconnection pattern, and the top surface of the second barrier layer.

19. The method of claim 16, wherein a first inner lateral surface of the undercut region is inclined toward the top surface of the first dielectric layer and a second inner lateral surface of the undercut region is inclined toward the top surface of the interconnection pattern, the first and second inner lateral surfaces respectively exposing the first dielectric layer and the interconnection pattern.

* * * * *